(12) United States Patent
Kuroki

(10) Patent No.: US 6,212,125 B1
(45) Date of Patent: Apr. 3, 2001

(54) ASYNCHRONOUS SEMICONDUCTOR MEMORY DEVICE WITH A CONTROL CIRCUIT THAT CONTROLS THE LATCH TIMING OF AN INPUT SIGNAL

(75) Inventor: Masaaki Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/313,284

(22) Filed: May 18, 1999

(30) Foreign Application Priority Data

May 19, 1998 (JP) .................................................. 10-136632

(51) Int. Cl.⁷ ....................................................... G11C 8/00
(52) U.S. Cl. ...................... 365/233; 365/195; 365/189.05
(58) Field of Search ..................................... 365/233, 195, 365/191, 194, 198, 230.08, 189.05

(56) References Cited

U.S. PATENT DOCUMENTS 5,546,354 * 8/1996 Partovi et al. ......................... 365/233
5,880,998 * 3/1999 Tanimura et al. ............... 365/189.05
5,898,331 * 4/1999 Fujita .................................. 327/296

* cited by examiner

Primary Examiner—David Nelms
Assistant Examiner—Thong Le
(74) Attorney, Agent, or Firm—Venable; Norman N. Kunitz

(57) ABSTRACT

A semiconductor memory device 10 which includes an input part 11 to which an first external input signal CLK is input, an second input part 12 to which an second external input signal A0 is input, a latch signal generating part 14 which generates a latch signal LAT in response to the first external input signal CLK, an an output part 15 which latches the second external input signal A0 in response to the latch signal LAT and outputs the input signal to outside of the control circuit, is characterized in that it is provided with an inhibiting signal generating part 13 generating an inhibiting signal ST1, which is input to the latch signal generating part in response to the first external input signal CLK and the other input signal A0 to inhibit generation of the latch signal.

9 Claims, 15 Drawing Sheets

ASYNCHRONOUS SEMICONDUCTOR MEMORY DEVICE WITH A CONTROL CIRCUIT THAT CONTROLS THE LATCH TIMING OF AN INPUT SIGNAL

FIELD OF THE INVENTION

The present invention relates to a semiconductor memory device, in particular, it relates to a semiconductor memory device provided with a control circuit which enables to increase timing margins of input setup time (hereinafter referred to as "TSI") and input hold time (hereinafter referred to as "THI") of a high speed dynamic random access memory (hereinafter referred to as "DRAM").

BACKGROUND OF THE INVENTION

A synchronous dynamic random access memory (hereinafter referred to as "SDRAM") is known as a storage medium which can be operated at high speed synchronizing with a clock signal input from an external terminal. As a SDRAM is designed to acquire all inputs at the rising edge from low state to high state of a system clock of an external input signal, a D-type flip-flop control circuit (hereinafter referred to as "control circuit") is usually used for acquiring input signals.

Constitution and operation of a prior control circuit 80 will be explained with reference to of FIG. 12 and the timing chart shown in FIG. 13. The control circuit 80 includes a first input part 81, a second input part 82, a latch signal generating part 84 and an output part 85 as its main components.

When an external input signal CLK generated from an external device such as CPU, is input to the first input part 81, a row address intake signal IN1 generated synchronizing with the external input signal CLK is transmitted through serially connected inverters 100, 102, 104, 106 sequentially, and a signal 107 output from the last inverter 106 is input to the latch signal generating part 84.

At this stage, the signal 107 is branched into two, one of which is input to one input of a NAND gate 114 through multiple and odd numbers of inverters 108, 110 and 112. The other signal is input directly to another input of the NAND gate 114. Responding to the time difference of two input signals input to the NAND gate 114, a row address latch signal LAT is output from the NAND gate 114 to the one-shot output part 85. In other words, when the row address intake signal IN1 rises from low to high state, the row address latch signal LAT as a one-shot signal generated in response to the rising edge of the signal IN1, is output to the output part 85.

On the other hand, when an external input signal A0 generated from an external device such as CPU, is input to the second input part 82, a row address intake signal IN2 generated synchronizing with the external input signal A0 is transmitted through serially connected inverters 120, 122, 124, 126 sequentially, and a signal A0D output from the last inverter 126 is input to the output part 85.

At the output part 85, the row address latch signal LAT output from the latch signal generating part 84 is input to a gate of a PMOS 127, a gate of a NMOS 128 through an inverter 134, and a gate of a NMOS of a clocked inverter 132, respectively. The signal A0D which is output from the second input part 82 through the inverters 120, 122, 124 and 126 sequentially is input to a source of the PMOS 127 and a drain of the NMOS 128, respectively.

The PMOS 127 and the NMOS 128 is turned into on state, when the row address intake signal LAT is in low state, acquire the signal A0D and output a signal A0H. The signal A0H is transmitted through serially connected inverters 129 and 131, and an inner row address signal A0X is output from the last inverter 131. An output of the inverter 129 is input to the clocked inverter 132 as well as to the inverter 131. The output of the clocked inverter 132 is again input to the inverter 129. The clocked inverter 132 is inhibited to output a signal as long as the row address latch signal LAT remains in low state, thereby the signal A0H is unlatched. When the row address latch signal LAT rises from low state to high state, the clocked inverter 132 latches the signal A0H to inhibit the switching of the inner row address signal A0X.

Next, a TSI standard and a THI standard will be explained with reference to the timing chart shown in FIG. 13. The TSI standard relates to a time interval between the falling edge of the external input signal A0 from high state to low state at a time T1, and the rising edge of the external signal CLK from low state to high state at a time T2, (T2–T1). The TSI standard is set as the standard of a device. The THI standard relates to a time interval between the rising edge of the external signal CLK from low state to high state at the time T2, and the rising edge of the external input signal A0 from low state to high state at a time T3 (T3–T2). The THI standard is also set as a standard of the device.

As shown in FIG. 13, with the falling edge of the external input signal A0 from high state to low state at the time T1 the signal IN2 and the signal A0D are switched from high state to low state sequentially. In response to the falling edge of the row address latch signal LAT from high state to low state, the PMOS 127 and the NMOS 128 output the state of the signal A0D to the signal A0H. The clocked inverter 132 inhibits the switching of the signal A0H in response to the rising edge of the row address latch signal LAT from low state to high state. That is, when the external input signal A0 rises from low state to high state in accordance with the TSI standard, a float time TA, which is the time interval between the falling edge of the signal A0H from high state to low state and the rising edge of the row address latch signal LAT from low state to high state, is caused.

Consequently, as shown in the timing chart of FIG. 14, it is made possible to delay the falling edge of the external signal A0 till a time T1 at which the value of the float time TA becomes 0. As a result, the time interval between T1 and T1'(T1'–T1) is obtained as a TSI margin.

As also shown in FIG. 13, when the external signal A0 is turned from low to high state at the time T3, the signal IN2 and the signal A0D are switched from low to high state sequentially. On the other hand, in response to the rising edge of the row address latch signal LAT from low to high state, the NMOS 127 and the PMOS 128 inhibit the state of the signal A0D from being output to A0H. Accordingly, when the external input signal rises from low to high state in accordance with the THI standard, a float time TB between the rising edge of the row address latch signal LAT and the rising edge of the signal A0D is obtained.

Consequently, as shown in the timing chart of FIG. 15, it is made possible to advance the rising edge of the external signal A0 to a time T3' at which the value of the float time TB becomes 0. As a result, the time interval between T3 and T3' (T3–T3') is obtained as the THI margin.

In the control circuit 80 according to the prior art, the TSI margin can be increased by delaying the rising edge of the row address latch signal LAT from low to high state and thereby increasing the float time TA. However, the decrease of the float time TB resulted from delay of the rising edge of the row address latch signal LAT causes decrease of the THI margin.

On the other hand, the THI margin can be increased by advancing the rising edge of the row address latch signal LAT from low to high state and thereby increasing the float time TB. However, the decrease of the float time TA resulted from the advance of the rising edge of the row address latch signal LAT causes a decrease of the TSI margin.

SUMMARY OF THE INVENTION

The present invention has been made in view of the above-mentioned problem, in association with the prior art semiconductor memory device. Therefore an object of the invention is to provide a novel and improved semiconductor device wherein timing margins of both TSI and THI standards of SDRAM can be increased.

In order to solve the above-mentioned problem, according to the first aspect of the invention, there is provided a semiconductor memory which includes a first input part to which a first external input signal is input, a second input part to which a second external input signal is input, a latch signal generating part which generates a latch signal in response to the first external input signal, and an output part which latches the second external input signal in response to the latch signal and outputs the signal to outside of the circuit. In addition, the semiconductor memory device according to the invention is provided with an inhibiting signal generating part which, in response to the first external input signal and the second external input signal, generates an inhibiting signal to restrain generation of the latch signal, which is to be input to the latch signal generating part. The inhibiting signal generating part may be designed to generate an inhibiting signal only when the second external input signal is switched from high to low state. With this structure, it is made possible to increase the TSI margin without decreasing the THI margin.

In addition, the inhibiting signal generating part may be designed to generate the inhibiting signal only when the second external input signal is switched from low to high state. With this structure, it is made possible to increase the TSI margin without decreasing the THI margin. Further, more particularly, the TSI margin of high-enabled DQM (data input/output mask) external input signal which is used in SDRAM can also be increased.

More preferably, the inhibiting signal generating part may be designed to generate the inhibiting signal only when the state of the second external input signal shows any change. With this structure, it is made possible to increase the TSI margin without decreasing the THI margin. Furthermore, it is made possible to increase the TSI margins of the address of the external input signal which is made enabled both in high and low state, and of the Data Input signal.

According to the second aspect of the invention, there is provided a semiconductor memory which includes a first input part to which a first external input signal is input, a second input part to which the second external input signal is input, a latch signal generating part which generates a latch signal in response to the first external input signal, and an output part which acquires the second external input signal in response to the latch signal and output the signal to the outside of the circuit. The semiconductor memory device is further provided with a delay part which, in response to the first external input signal, changes the transmission speed of the second external input signal from the second input part to the output part. The delay part is provided with the multiple transmission paths to transmit the second external input signal and a selection part which selects a proper transmission path. The transmission paths may be provided with inverters. With this structure, it is made possible to delay transmission of the second external input signal in accordance with the first external input signal. Consequently, the THI margin can be increased without decreasing the TSI margin.

Further, the delay part is provided with multiple transmission paths to transmit the second external input signal and a selection part which selects a proper transmission path. The transmission paths may be provided with resistances. With this structure, it is made possible to delay to transmission of the second external input signal in accordance with the first external input signal. Consequently, the THI margin can be increased without decreasing the TSI margin. This structure is also advantageous in that it enables to decrease momentary current because electric charge is transferred through resistance. Further, if the device adapts this structure, it can be realized that degree of voltage dependence is made relatively small when the transmission of the signal is delayed.

Still further, the delay part is provided with multiple transmission paths to transmit the second external input signal and a selection part which selects a proper transmission path. The delay part may be designed so that the number of driving transistors provided at the transmission path used for delaying transmission in the delay part is smaller than the numbers of the driving transistors provided at ordinary transmission paths. With this structure, it is made possible to delay transmission of the second external input signal in accordance with the first external input signal. Consequently, the THI margin can be increased without decreasing the TSI margin. In addition, it is also made possible to decrease the value of the electric consumption resulted from decrease of the number of transistors.

Still further, the delay part is provided with multiple transmission paths to transmit the second external input signal and a selection part which selects a proper transmission path. It may be designed that transmission paths in the delay part is provided with capacitors. With this structure, it is made possible to delay to transmission of the second external input signal in accordance with the first external input signal. Consequently, the THI margin can be increased without decreasing the TSI margin. In addition, it is also made possible to decrease momentary current as transmission of the signal is delayed by charge and discharge of capacitors. Further, if the device adapts this structure, it can be realized that degree of voltage dependence is made relatively small when transmission of the signal is delayed.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings.

PREFERRED EMBODIMENTS OF THE INVENTION

Some preferred embodiments of a semiconductor memory device according to the present invention will now be described in the following with reference to the accompanying drawings. It is to be noted that in the following explanation, the same reference numbers are assigned to components having essentially identical functions and structural features to preclude the necessity for repeated explanation thereof.

(The First Embodiment)

Figure 1:
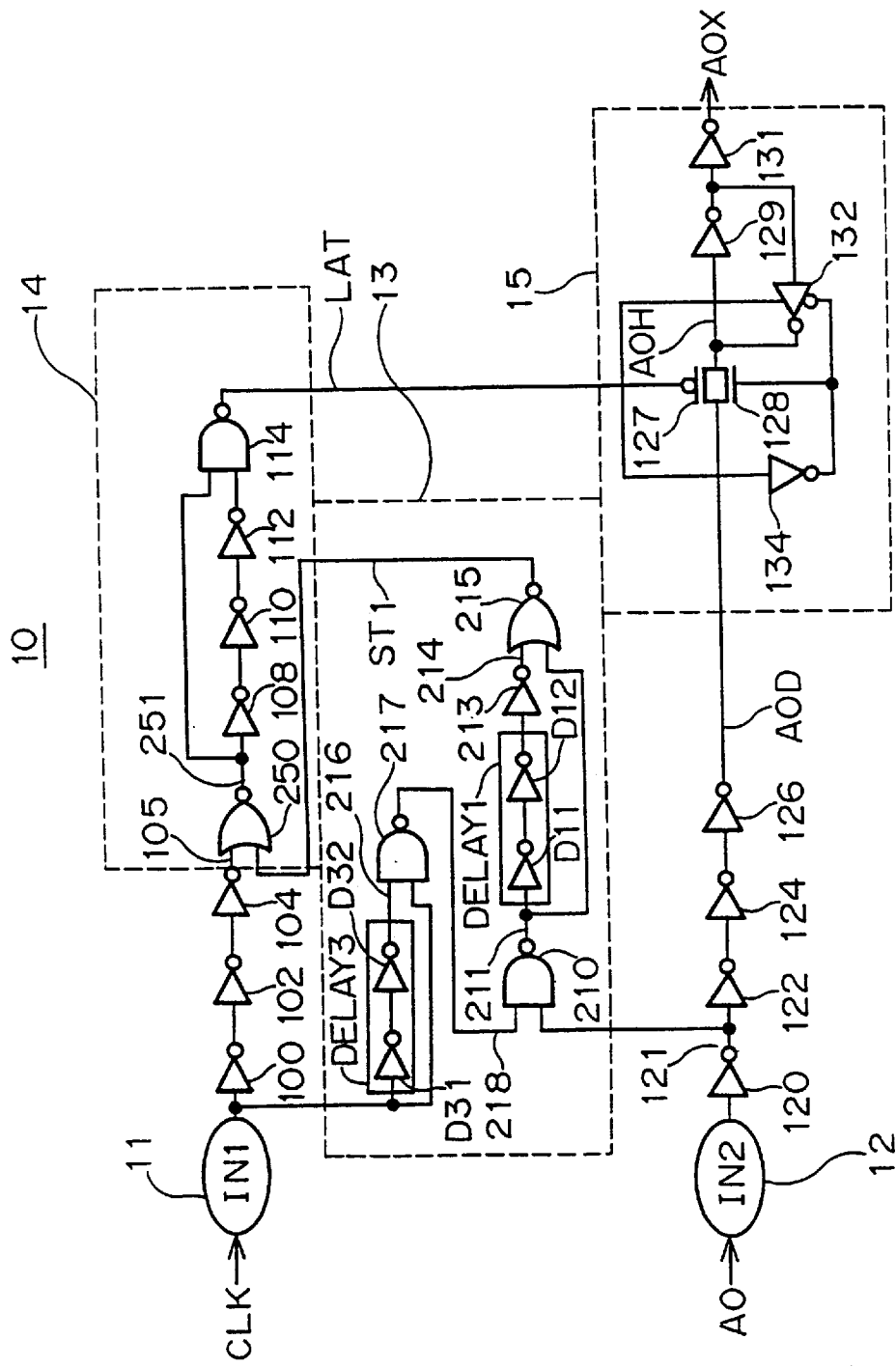
FIG. 1 is a schematic view illustrating the structure of the control circuit according to the first embodiment of the present invention.
Figure 12:
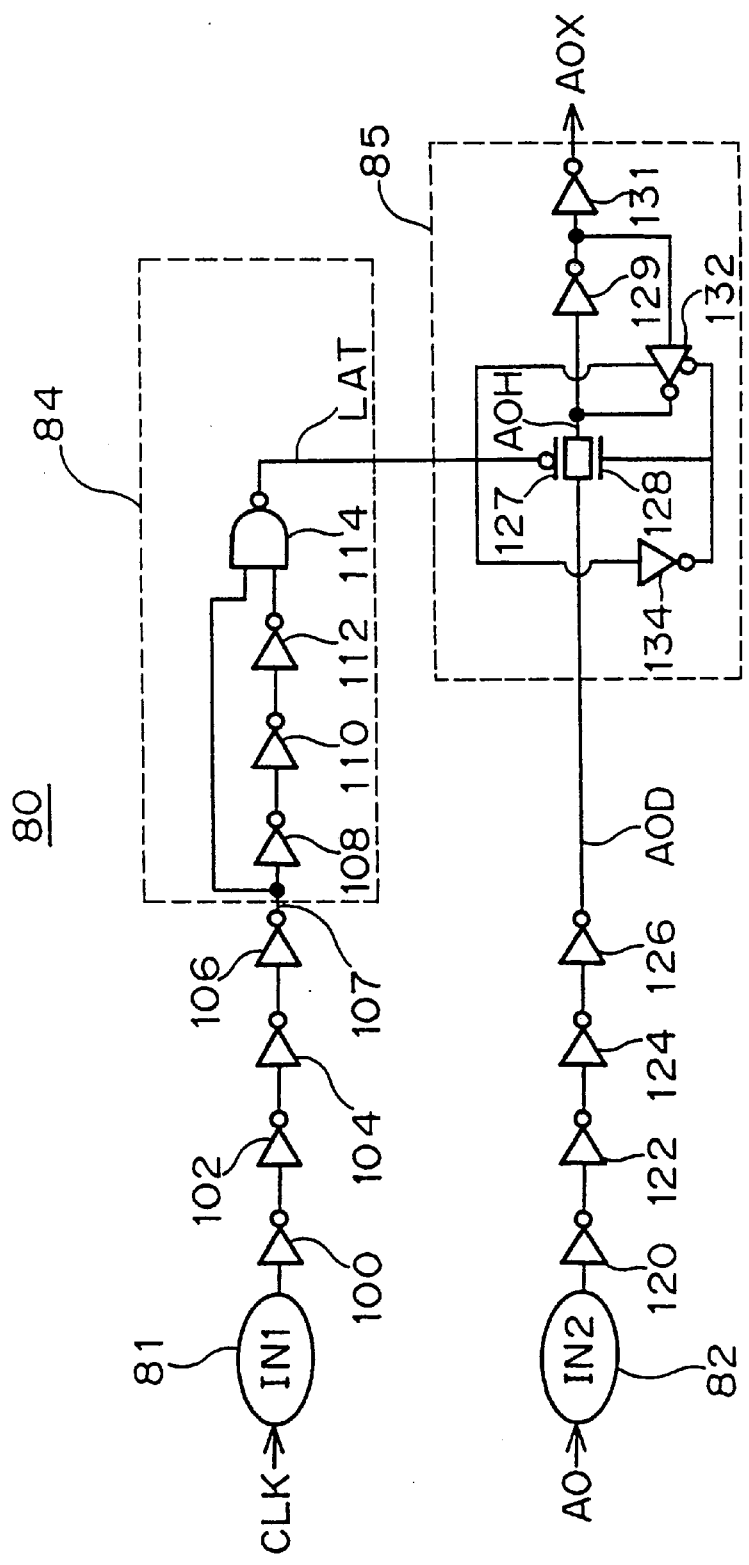
FIG. 12 is a schematic view illustrating the structure of the control circuit according to the prior art.
Figure 13:
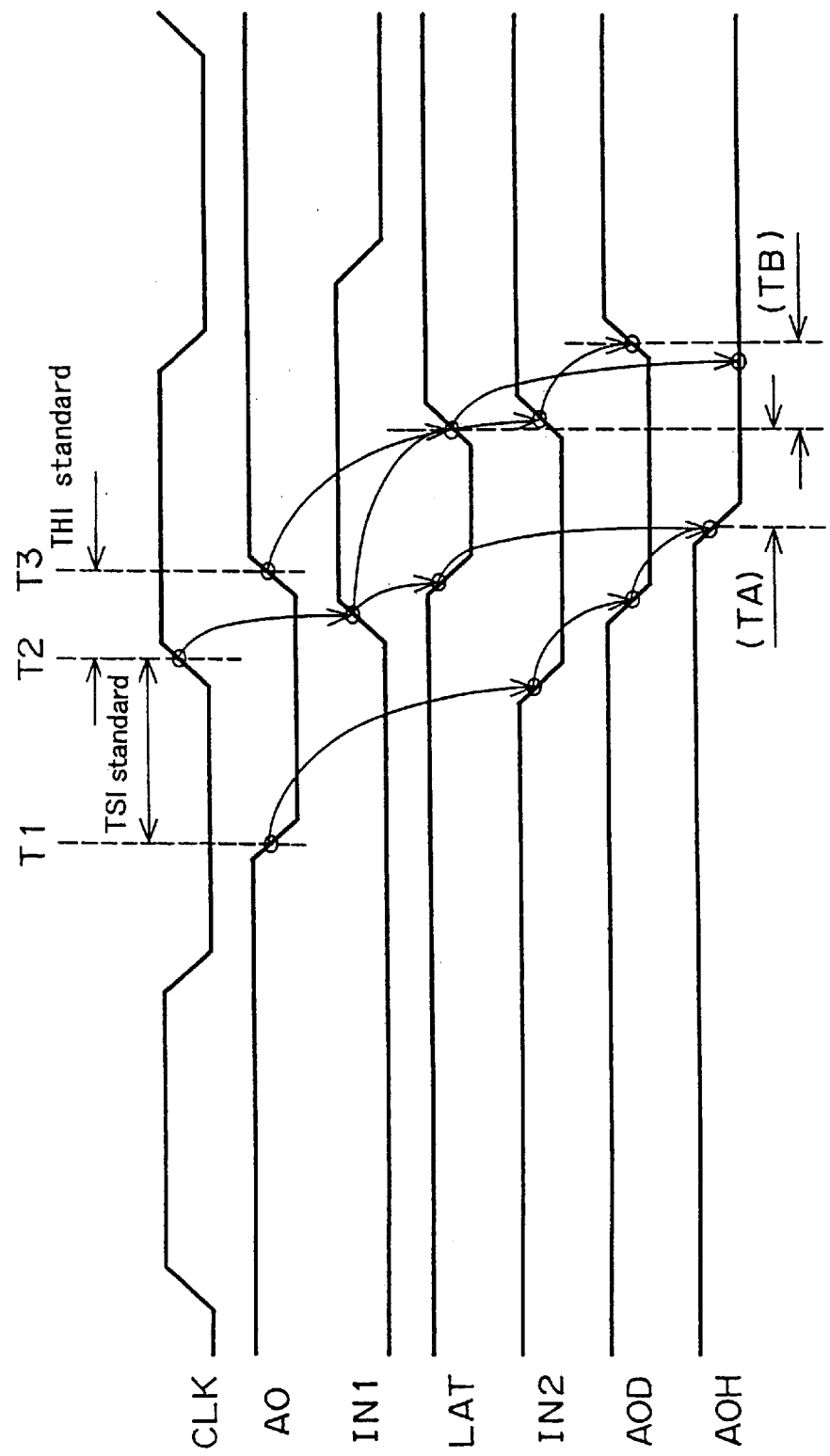
FIG. 13 is a timing chart of the control circuit shown in FIG. 12.
Figure 14:
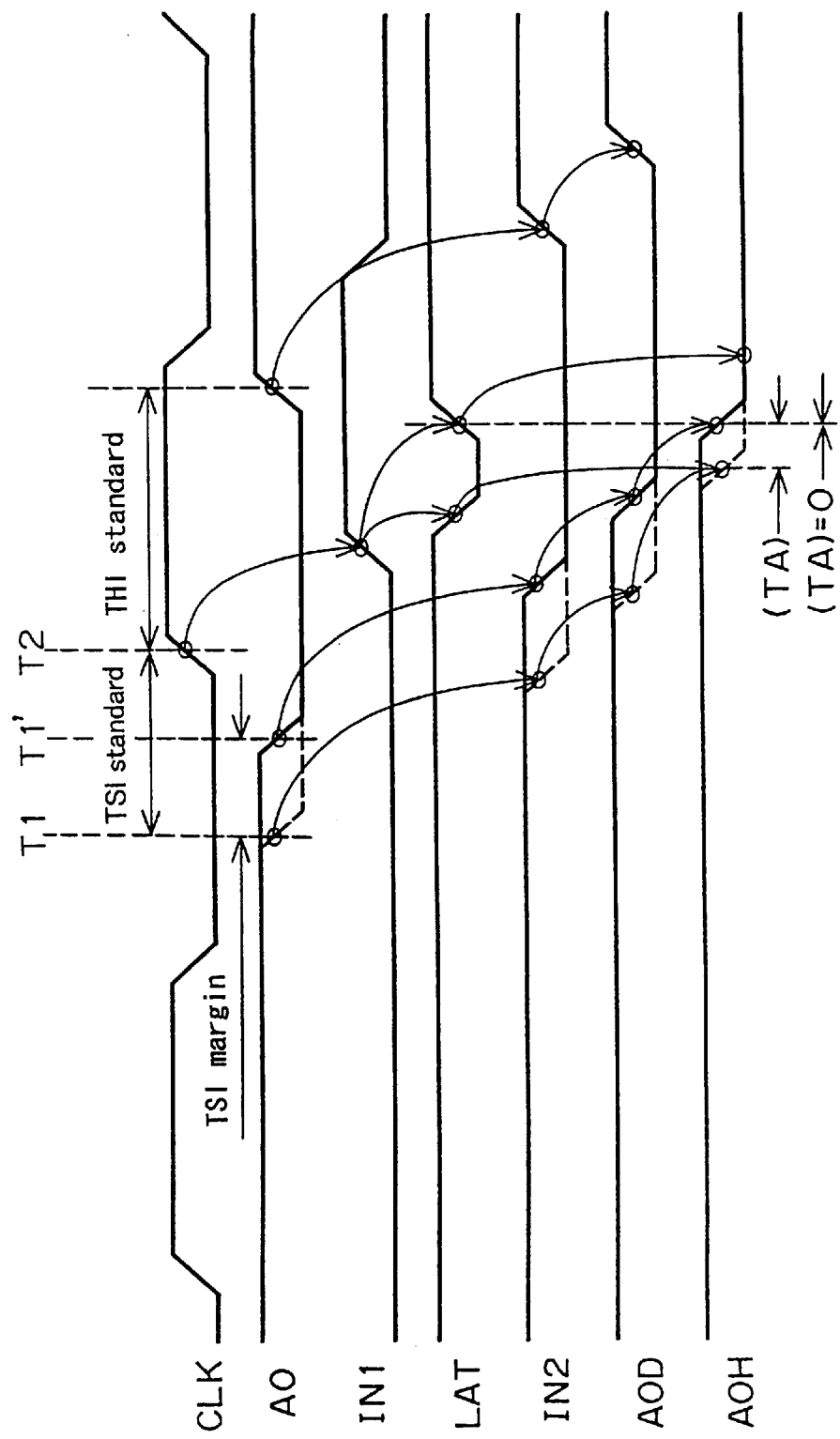
FIG. 14 is a timing chart showing the TSI margin of the control circuit shown in FIG. 12.
Figure 15:
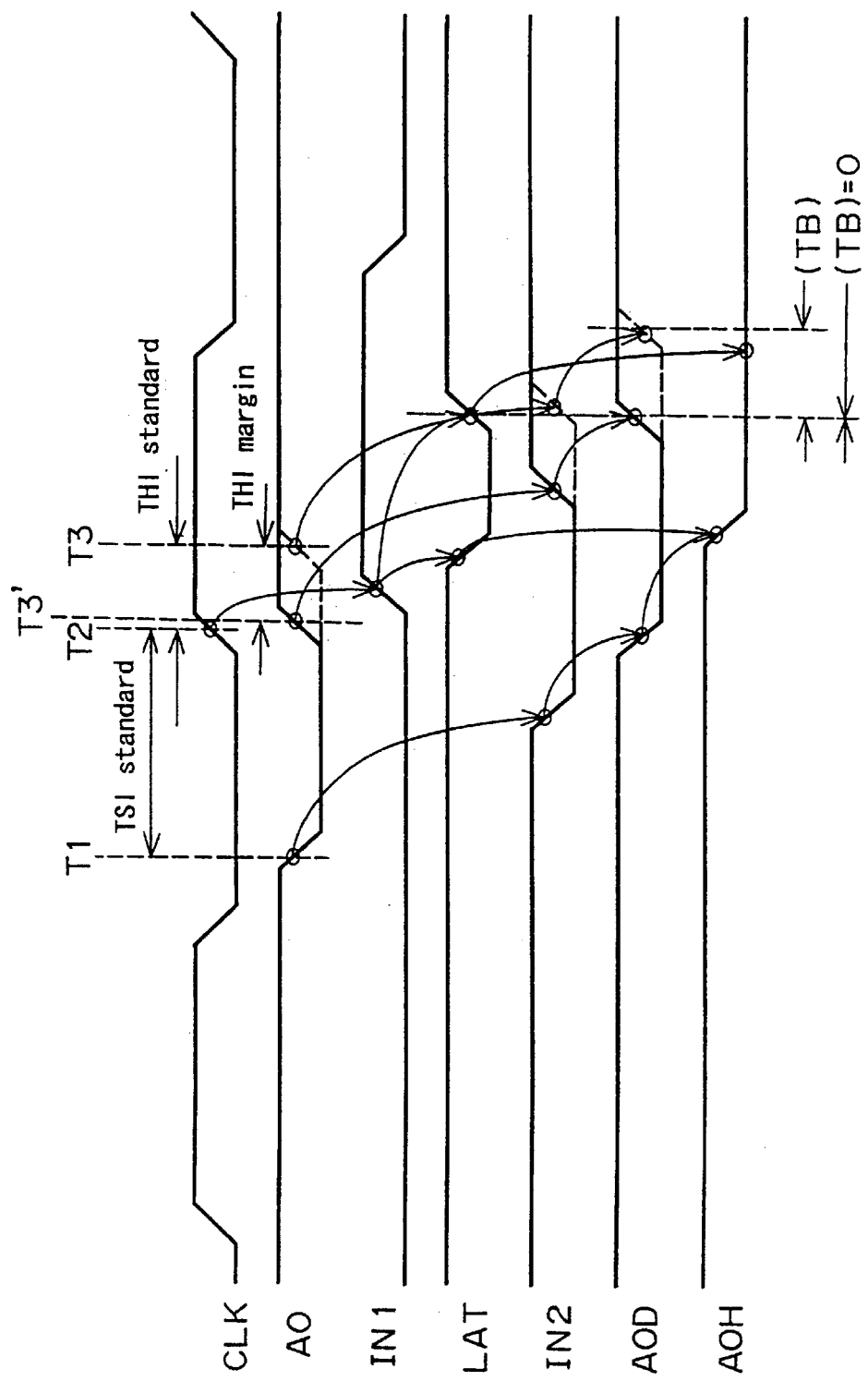
FIG. 15 is a timing chart showing the THI margin of the control circuit shown in FIG. 12.

Control circuits 10, 20 and 30 which can increase a TSI margin without decreasing a THI margin are described in the following. First, the control circuit 10 according to the first embodiment of the invention is explained with reference to FIG. 1. In the followings, the difference of the control circuits from the control circuit 80 according to the prior art shown in FIG. 12 will be described.

The control circuit 10 includes a first input part 11, a second input part 12, an inhibiting signal generating part 13, a latch signal generating part 14 and an output part 15 as its main components. The first embodiment is characterized in that a pulse generation inhibiting signal STI generated at the inhibiting signal generating part 13 restrains generation of a row address latch signal LAT which is generated at the latch signal generating part 14.

A row address intake signal IN1 generated synchronizing with an external input signal CLK is branched into two, one of which is input to the inhibiting signal generating part 13, while the other of which is transmitted thorough serially connected inverters 100, 102 and 104, and a signal 105 output from the last inverter 104 is input to the latch signal generating part 14.

A signal IN2 generated synchronizing with an external input signal A0 is branched into two through an inverter 120. One branched signal 121 is input to the inhibiting signal generating part 13, while the other signal is transmitted thorough inverters 122, 124 and 126, and a signal A0D output from the last inverter 126 is input to the output part 15.

In the inhibiting signal generating part 13, the row address intake signal IN1 output from the first input part 11 is again branched into two, one of which is transmitted through a delay path DELAY3 provided with multiple and even numbers of inverters D31 and D32, and a signal 216 is output from the last inverter D32, the other of which is transmitted through a path not provided with the inverters. Then both branched signals are input to a NAND gate 217. Then the NAND gate 217 outputs a signal 218.

The signal 218 output from the NAND gate 217 and the signal 121 output from the second input part 12 through the inverter 120 are input to a NAND gate 210. The NAND gate 210 outputs a signal 211. The signal 211 is branched into two, one of which is transmitted through a delay path DELAY1 provided with multiple and even numbers of inverters D11 and D12 and also through an inverter 213, and a signal 214 is output from the last inverter 213, the other of which is transmitted through a path which does not include inverters. Then both branched signals are input to a NOR gate 215. Responding to the time difference of the two signals being input to the NOR gate, the NOR gate 215 makes a one-shot output of a pulse generation inhibiting signal STI.

In the latch signal generating part 14, the signal 105 output from the first input part 11 and transmitted through the inverters 100, 102 and 104, and the pulse generation inhibiting signal ST1 are input to a NOR gate 250, which outputs a signal 251. The signal 251 is branched into two, one of which is transmitted through a path provided with inverters 108, 110 and 112, and the other of which is transmitted through a path which does not include inverters. Both branched signals are then input to a NAND gate 114. Responding to the time difference of the two signals input to the NOR gate 114, the NOR gate 114 makes a one-shot output of the row address latch signal LAT.

The signal A0D output from the second input part 12 and the row address latch signal LAT are input to the output part 15, which outputs an inner row address signal A0X in the similar way to the prior control circuit 80.

The control circuit 10 according to the first embodiment of the invention has the above-mentioned structure. In the next, the operation of the control circuit 10 is described with reference to the timing chart in FIG. 2.

When an external input signal A0 is switched from high to low state, the signal IN1 switched synchronizing with the signal A0 is switched from high to low state, whereas the signal 121 is switched from low to high state. At this stage, if the row address intake signal IN1 is in low state, the NAND gate 210 outputs the signal 211 in low state. The NOR gate 215 outputs the signal in high state, when both the signals 211 and 214 are turned to low state. The signal output from the NOR gate 215 is kept at high state till the signal 214, which is transmitted through the delay path DELAY1 as the signal 211, is switched from low state to high state.

When the row address intake signal IN1 is switched from low state to high state, and thereby switching the signal 105 from high state to low state, the signal 251 remains in low state as long as the pulse generation inhibiting signal ST1 is in high state. Accordingly, the row address latch signal LAT is inhibited from falling from high state to low state. With the pulse generation inhibiting signal ST1 switching from high to low state while the signal 105 remains in low state, the NOR gate 250 is made enabled and switches the signal 251 from low to high state, thereby makes the row address latch signal LAT one-shot low. In short, generation of the row address latch signal LAT is restrained as long as the pulse generation inhibiting signal remains in high state.

In addition, even though the row address intake signal IN1 is switched from low to high state, the signal 218 is kept at high state until the signal 216 output from the delay path DELAY3 is switched to high state. Thus, the pulse generation inhibiting signal ST1 can be kept at high state for enough time interval, which depends on the number of inverters provided in the delay path DELAY1.

As the control circuit 10 according to the first embodiments of the invention adapts the above-mentioned constitution and the operation, there is given the following advantageous effects.

When the value of the TSI of the external input signal is large enough, the row address intake signal IN1 is switched from low to high state, the signal 105 is thereby switched from high to low state. In this case, as the pulse generation inhibiting signal ST1 is in low state after outputting the one-shot high pulse, the control circuit according to the first embodiment of the invention performs the same operation as the prior control circuit 80. On the other hand, when the value of TSI of the external input signal is small, it is made possible to delay generation of the row address latch signal LAT by the one-shot high pulse of the pulse generation inhibiting signal ST1 which makes the NOR gate 250 being disabled. Consequently, as the rising edge of the row address latch signal LAT from low to high state can also be delayed, a float time TA is increased, and the TSI margin is thereby increased.

Figure 3:
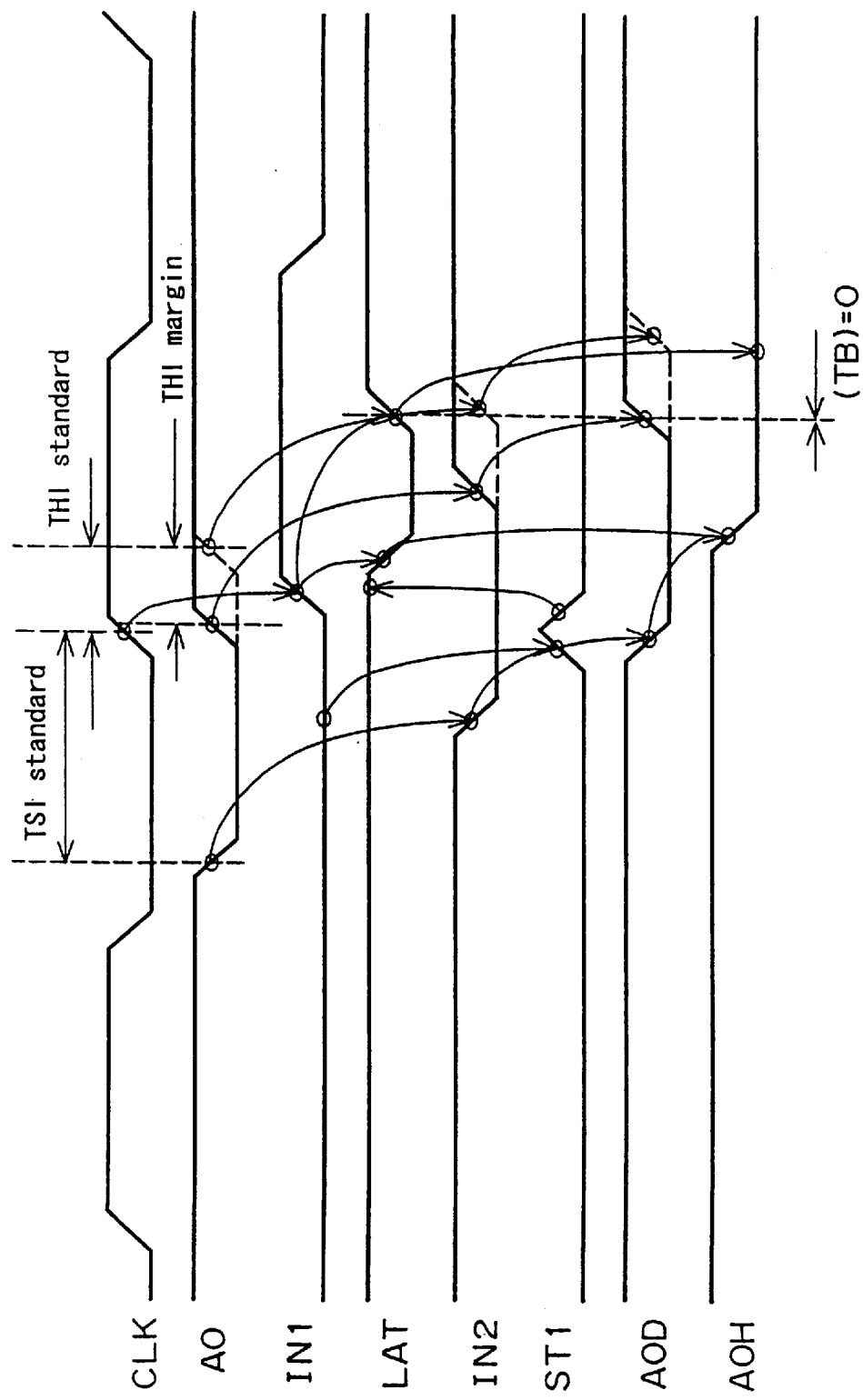
FIG. 3 is a timing chart showing the THI margin of the control circuit shown in FIG. 1.

In the next, it is explained with reference to the THI timing chart of the control circuit 10 shown in FIG. 3 that the THI margin is not decreased, even though the TSI margin increase through the above-mentioned steps. When the external signal A0 is input with TSI standard, the signal IN2 is switched from high to low state, causing the pulse generation inhibiting signal ST1 to generate a one-shot high pulse. If the pulse width of the pulse generation inhibiting signal ST1 is adjusted so that the pulse generating inhibiting signal ST1 is switched from high to low state before the row address intake signal IN1 switches the signal 105 from high to low state, the row address latch signal LAT is generated at the same timing as generation of the row address latch signal of the prior control circuit 80. Thus, the value of a float time TB is made equivalent to that of the float time TB of the prior control circuit 80. Consequently, a value of THI margin is also made equivalent to that of the prior circuit 80.

As has been described above, according to the control circuit 10, the TSI margin can be increased without decreasing the THI margin. It is to be noted that the control circuit 10 is effective to the low-enabled external input signal A0.

(Second Preferred Embodiment)

Figure 4:
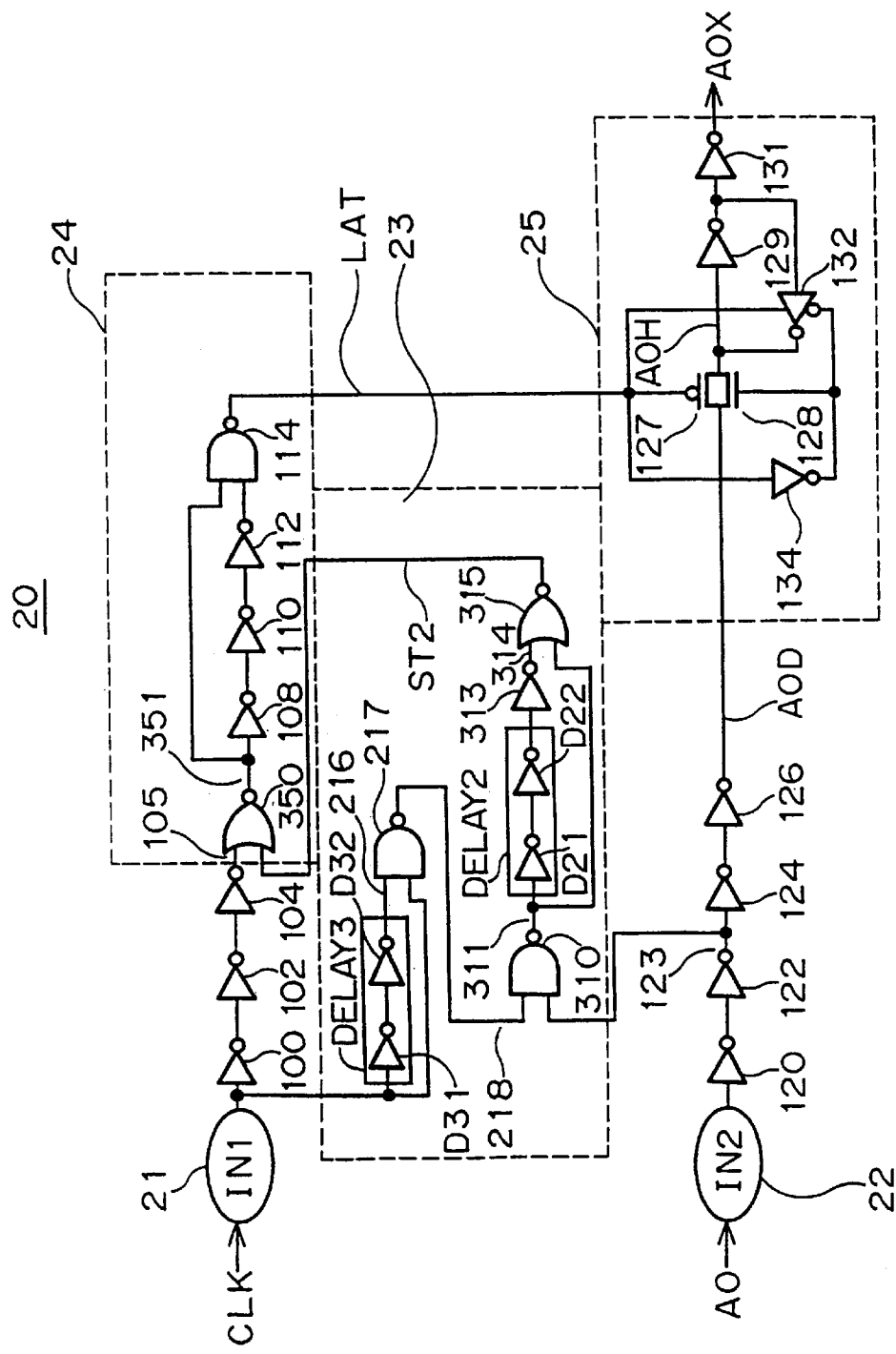
FIG. 4 is a schematic view illustrating the structure of the control circuit according to the second embodiment of the present invention.

In the following, the structure of a control circuit 20 according to the second embodiment of the invention is described with reference to FIG. 4.

A row address intake signal IN1 generated synchronizing with an external input signal CLK is branched into two, one of which is input to an inhibiting signal generating part 23, while the other of which is transmitted thorough serially connected inverters 100, 102 and 104, and a signal 105 output from the last inverter 104 is input to a latch signal generating part 24.

A signal IN2 generated synchronizing with an external input signal A0 is branched into two through inverters 120 and 122. One branched signal 123 is input to the inhibiting signal generating part 23, while the other signal is transmitted thorough inverters 124 and 126, and a signal A0D output from the last inverter 126 is input to an output part 25. In the control circuit 20, the signal IN2 is input to the inhibiting signal generating part 23 after the signal IN2 is transmitted through two inverters 120 and 122. With this structure, the control circuit 20 is made effective to the high-enabled external signal A0.

In the inhibiting signal generating part 23, the row address intake signal IN1 output from the first input part 21 is again branched into two, one of which is transmitted through a delay path DELAY3 provided with multiple and even numbers of inverters D31 and D32, which outputs a signal 216. The signal 216 and the other branched signal transmitted through a path not provided with inverters are input to a NAND gate 217, which outputs a signal 218.

The signal 218 output from the NAND gate 217 and the signal 123 output from the second input part 22 through the inverters 120 and 122 are input to a NAND gate 310, which outputs a signal 311. The signal 311 is branched into two, one of which is transmitted through a delay path DELAY2 provided with multiple and even numbers of inverters D21 and D22 and also through an inverter 313, which outputs a signal 314. The signal 314 and the other branched signal transmitted through a path which does not include inverters are input to a NOR gate 315. Responding to the time difference of the two signals being input to the NOR gate 315, the NOR gate 315 makes a one-shot output of the pulse generation inhibiting signal ST2.

In the latch signal generating part 24, the signal 105 output from the first input part 21 and transmitted through the inverters 100, 102 and 104, and the pulse generation inhibiting signal ST2 are input to a NOR gate 350, which outputs a signal 351. The signal 351 is branched into two, one of which is transmitted through a path provided with inverters 108, 110 and 112, and the other of which is transmitted through a path which does not include inverters. Both branched signals are then input to a NAND gate 114. Responding to the time difference of the two signals being input to the NAND gate 114, the NAND gate makes a one-shot output of a row address latch signal LAT.

The signal A0D output from the second input part 22 and the row address latch signal LAT are input to the output part 25, which outputs a row address signal A0X in the similar way to the prior control circuit 80.

Figure 2:
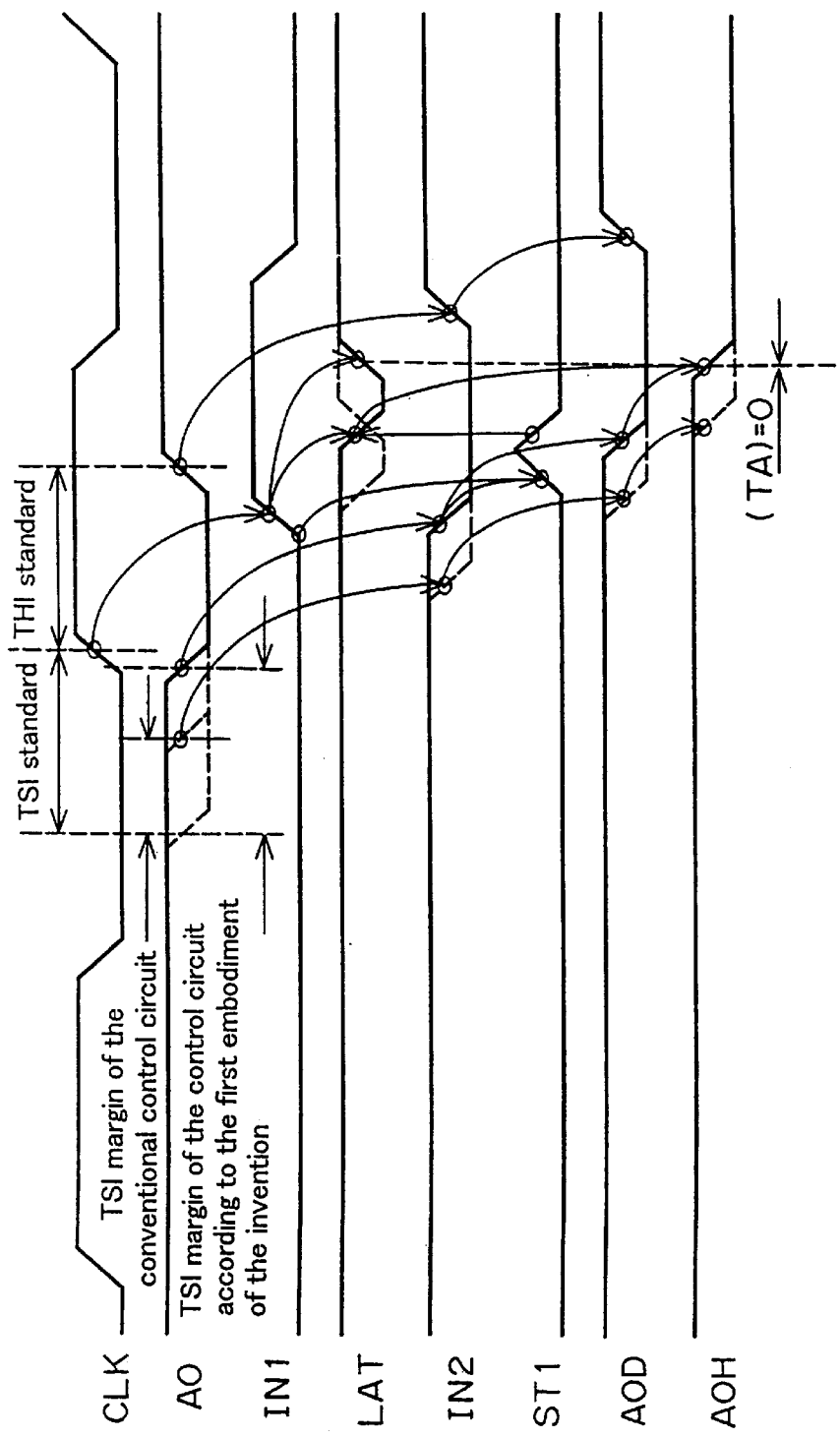
FIG. 2 is a timing chart showing the TSI margin of the control circuit shown in FIG. 1.

The timing chart of the control circuit 20 is the same as the timing chart of the control circuit 10 shown in FIG. 2. In the following, the operation of the control circuit 20 is described with reference to the timing chart in FIG. 2.

When the external input signal A0 is switched from low to high state, the signal IN2 switched synchronizing with the signal A0 and the signal 123 are switched from low to high state. At this stage, if the row address intake signal IN1 is in low state, the NAND gate 310 outputs the signal 311 in low state. The NOR gate 315 outputs the signal in high state, when both the signals 311 and 314 are turned to low state. The signal output from the NOR gate 315 is kept at high state till the signal 314, which is transmitted through the delay path DELAY2 as the signal 311, is switched from low state to high state.

When the row address intake signal IN1 is switched from low state to high state, and thereby switches the signal 105 from high state to low state, the signal 351 remains in low state as long as the pulse generation inhibiting signal ST2 is in high state. Accordingly, the row address latch signal LAT is inhibited from falling from high state to low state. With the pulse generation inhibiting signal ST2 switching from high to low state while the signal 105 remains in low state, the NOR gate 350 is made enabled and switches the signal 351 from low to high state, thereby making the row address latch signal LAT one-shot low. In short, generation of the row address latch signal LAT is restrained as long as the pulse generation inhibiting signal ST2 remains in high state.

In addition, even though the row address intake signal IN1 is switched from low to high state, the signal 218 is kept at high state until the signal 216 output from the delay path DELAY3 is switched to high state. Thus, the pulse generation inhibiting signal ST2 can be kept at high state for enough time interval, which depends on the number of inverters provided at the delay path DELAY2.

As the control circuit 20 according to the second embodiments of the invention adapts the above-mentioned constitution and the operation, there is given the following advantageous effects. According to the control circuit 20, the TSI margin can be increased without decreasing the THI margin.

In addition, it is to be noted that the control circuit 20 is effective to the high-enabled external input signal. In particular, it is made possible to increase the TSI margin of the external input signal DQM (data input/output mask) which is made high-enabled and used in SDRAM.

(Third preferred Embodiment)

Figure 5:
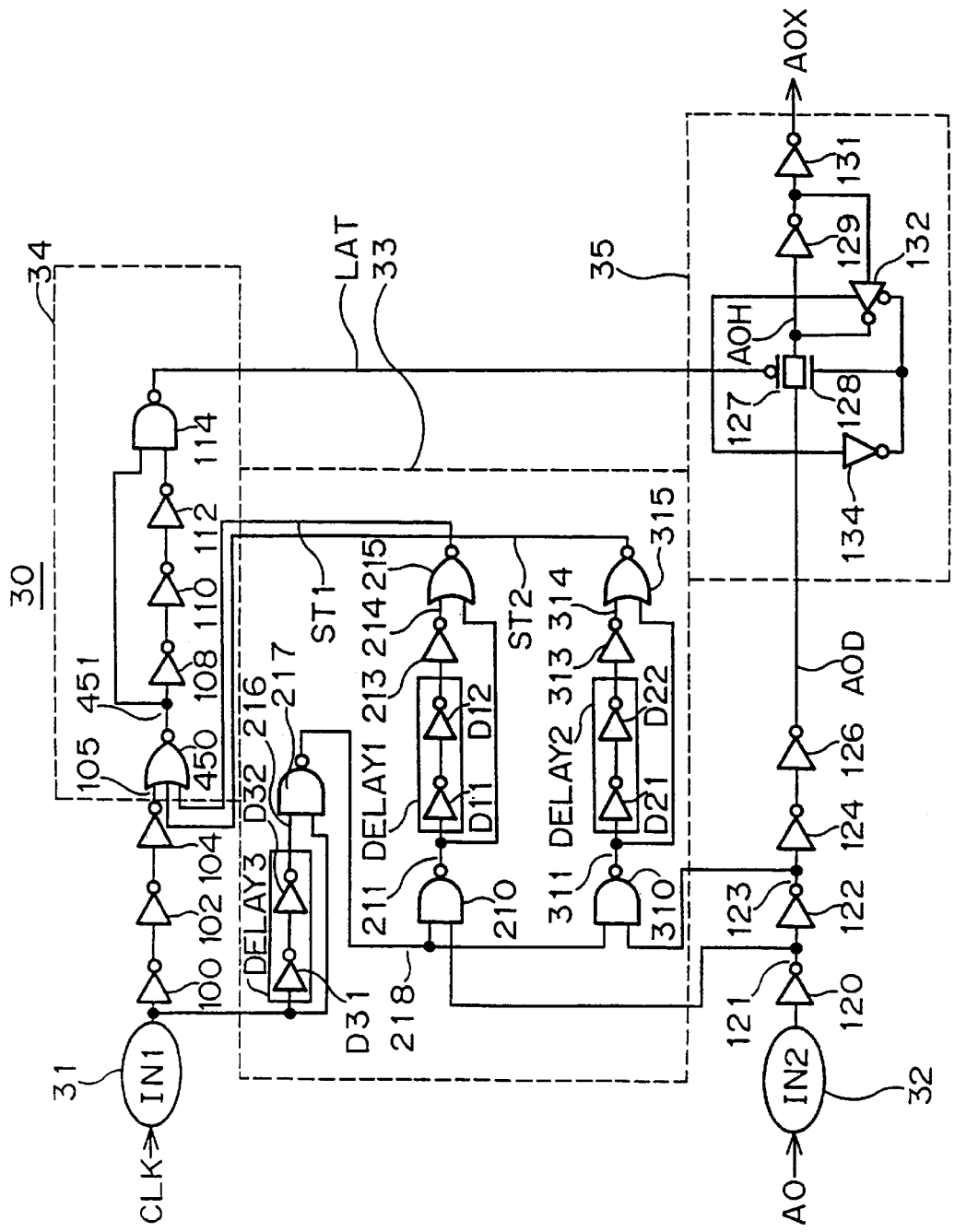
FIG. 5 is a schematic view illustrating the structure of the control circuit according to the third embodiment of the present invention.

In the following, the structure of a control circuit 30 according to the third embodiment of the invention is described with reference to FIG. 5.

A row address intake signal IN1 generated synchronizing with the external input signal CLK is branched into two, one of which is input to an inhibiting signal generating part 33, the other of which is transmitted thorough serially connected inverters 100, 102 and 104, a signal 105 output from the last inverter 104 is input to a latch signal generating part 34.

A signal IN2 generated synchronizing with an external input signal A0 is branched into two through an inverter 120. One of the branched signal is input to one input of a NAND gate 210 provided at an inhibiting signal generating part 33. Other signal is transmitted thorough an inverter 122 and again branched into two, one of which is input to one input of a NAND gate 310 provided at the inhibiting signal generating part. The other branched signal is transmitted through inverters 124 and 126, and a signal A0D output from the last inverter 126 is input to an output part 35. As described above, the structure of the control circuit 30 is a mixture of the control circuit 10 according to the first embodiment of the invention and the control circuit 20 according to the second embodiment of the invention. Therefore, the control circuit 30 is effective to the external input signal A0 which is made enabled both in high and low states.

In the inhibiting signal generating part 33, the row address intake signal IN1 output from a first input part 31 is again branched into two, one of which is transmitted through a delay path DELAY3 provided with multiple and even numbers of inverters D31 and D32, and the inverter D32 outputs a signal 216. The signal 216 and the other branched signal transmitted through a path not provided with inverters are input to a NAND gate 217, which outputs a signal 218.

The signal 218 output from the NAND gate 217 and a signal 121 output from a second input part 32 through the inverter 120 are input to the NAND gate 210, which outputs a signal 211. The signal 211 is branched into two, one of which is transmitted through a delay path DELAY1 provided with multiple and even numbers of inverters D11 and D12 and also through an inverter 213, other of which is transmitted through a path which does not include inverters. Then both signals are input to a NOR gate 215. Responding to the time difference of the two signals being input to the NOR gate 215, the NOR gate makes a one-shot output of a pulse generation inhibiting signal ST1.

On the other hand, the signal 218 output from the NAND gate 217 and a signal 123 output from the second input part 32 through the inverters 120 and 122 are input to the NAND gate 310, which outputs a signal 311. The signal 311 is branched into two, one of which is transmitted through a delay path DELAY2 provided with multiple and even number of inverters D21 and D22 and also through an inverter 313, the other of which is transmitted through a path not provided with the inverters. Then, both signals are input to a NOR gate 315. Responding to the time difference of the two signals being input to the NOR gate, the NOR gate 315 makes a one-shot output of a pulse generation inhibiting signal ST2.

In the latch signal generating part 34, the signal 105 output from the first input part 31 and transmitted through the inverters 100, 102 and 104, and the pulse generation inhibiting signals ST1 and ST2 are input to a NOR gate 450, which outputs a signal 451. The signal 451 is branched into two, one of which is transmitted through a path provided with inverters 108, 110 and 112, and the other branched signal is transmitted through a path which does not include inverters. Both branched signals are then input to a NAND gate 114. Responding to the time difference of the two signals being input to the NAND gate 114, the NAND gate makes an one-shot output of a row address latch signal LAT.

The signal A0D output from the second input part 32 and the row address latch signal LAT are input to the output part 35, which outputs an inner row address signal A0X in the similar way to the prior control circuit 80.

The timing chart of the control circuit 30 is the same as the timing chart of the control circuit 10 shown in FIG. 2. In the following, the operation of the control circuit 30 is described with reference to the timing chart in FIG. 2.

When the external input signal A0 switches from high to low state, the signal IN2 switched synchronizing with the signal A0 is switched from high to low state, while the signal 121 is switched from low to high state. At this stage, if the row address intake signal IN1 is in low state, the NAND gate 210 outputs the signal 211 being in low state in the same way to the control circuit 10 of the first preferred embodiment. The NOR gate 215 outputs a signal in high state, when both the signals 211 and 214 are turned to low state. The signal output from the NOR gate 215 is kept at high state till the signal 214, which is transmitted through the delay path DELAY1 as the signal 211, is switched from low state to high state.

When the external input signal A0 switches from low to high state, the signal IN2 switched synchronizing with the signal A0 is switched to low to high state, and a signal 123 is also switched from low to high state. At this stage, if the row address intake signal IN1 is in low state, the NAND gate 310 outputs the signal 311 being in low state. The NOR gate 315 outputs the signal in high state in the same way as the control circuit 20 of the second preferred embodiment, when both the signals 311 and 314 are turned to low state. The signal output from the NOR gate 315 is kept at high state till the signal 314, which is transmitted through the delay path DELAY2 as the signal 311, is switched from low state to high state.

When the row address intake signal IN1 is switched from low state to high state, and thereby switching the signal 105 from high state to low state, the signal 451 remains in low state as long as either the pulse generation inhibiting signal ST1 or the pulse generation inhibiting signal ST2 is in high state. Accordingly, the row address latch signal LAT is inhibited from falling from high state to low state. With the pulse generation inhibiting signals ST1 and ST2 being switched from high to low state while the signal 105 remains in low state, the NOR gate 450 is made enabled and switches the signal 451 from low to high state, thereby making the row address latch LAT one-shot low. In short, generation of the row address latch signal LAT is restrained as long as the pulse generation inhibiting signals ST1 and ST2 remain in high state.

In addition, even though the row address intake signal IN1 is switched from low to high state, the signal 218 is kept at high state until the signal 216 output from the delay path DELAY3 is switched to high state. Thus, the pulse generation inhibiting signal ST1 can be kept at high state for enough time interval, which dependins on the number of inverters provided at the delay path DELAY2.

As the control circuit 30 according to the third embodiments of the invention adapts the above-mentioned constitution and the operation, there is given the following advantageous effects. According to the control circuit 30, the TSI margin can increase without decreasing the THI margin.

In addition, it is to be noted that the control circuit 30 is effective to an external input signal which is made enabled both in high and low states. Therefore, it is made possible to increase TSI margins of the external input signal's address and a Data Input signal which are made enabled both in high and low states.

(Fourth Preferred Embodiment)

Figure 6:
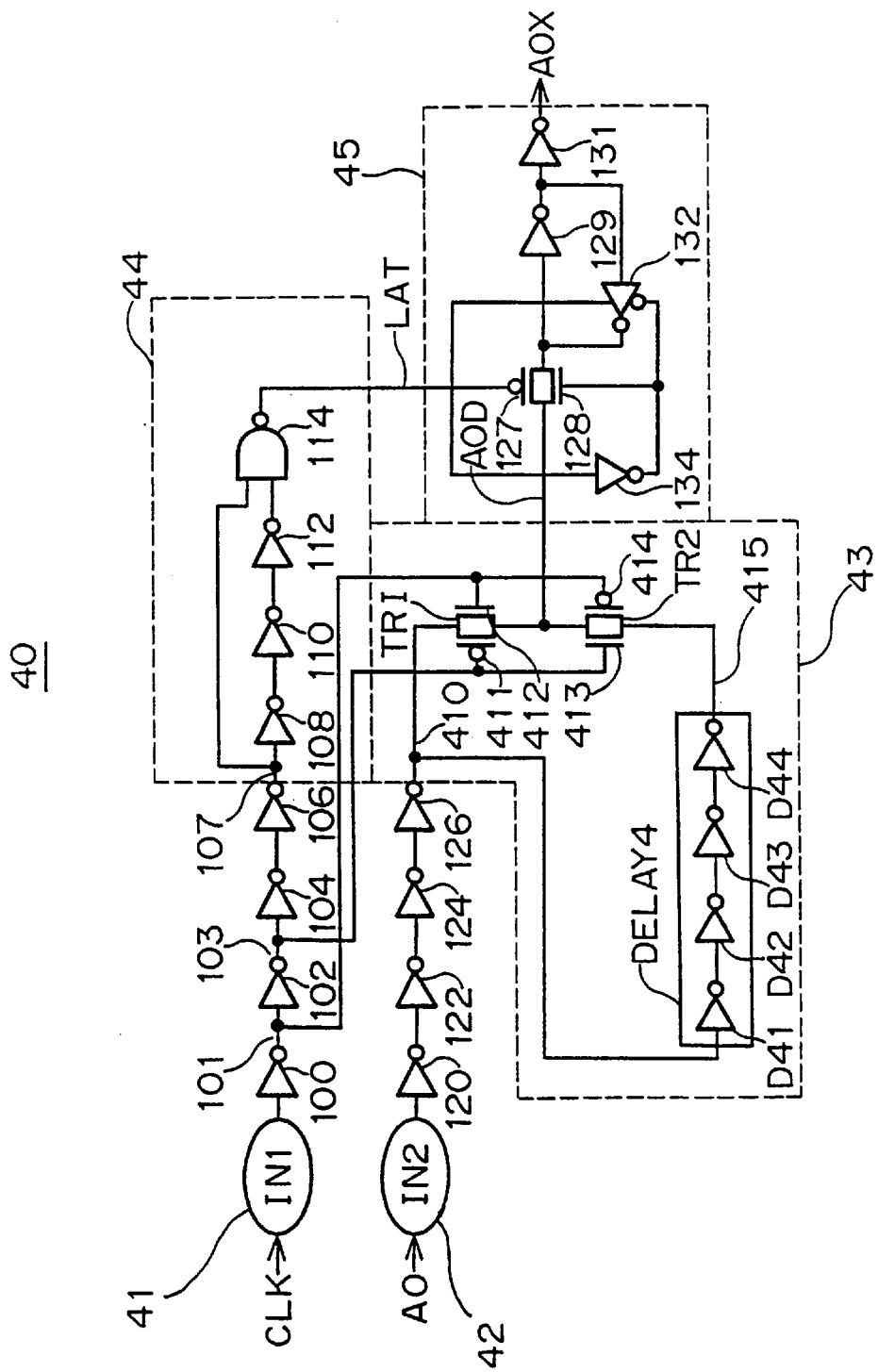
FIG. 6 is a schematic view illustrating the structure of the control circuit according to the fourth embodiment of the present invention.

Control circuits 40, 50, 60 and 70 in which a THI margin can be increased without decreasing a TSI margin are described in the following. First, the control circuit 40 according to the fourth embodiment of the invention is explained with reference to FIG. 6. In the followings, the difference of the control circuits from the control circuit 80 according to the prior art shown in FIG. 12 will be explained.

The control circuit 40 includes a first input part 41, a second input part 42, a delay part 43, a latch signal generating part 44 and an output part 45 as its main components. The fourth embodiment is characterized in that there is provided two transmission paths in the delay part 43 for transmission of a signal which is input from the second input part 42 to the delay part 43, and that transmission of the signal can be delayed by switching transmission paths.

A row address intake signal IN1 generated synchronizing with an external input signal CLK is branched into two after transmitted through an inverter 100. One branched signal 101 is input to gates of a NMOS 412 and a PMOS 414 which are provided at the delay part 43. Other branched signal is further branched into two through an inverter 102, one of which (a signal 103) is input to gates of a PMOS 411 and a NMOS 413 provided at the delay part 43. The other signal is input to the latch signal generating part 44 through serially connected inverters 104 and 106. The latch signal generating part 44 having the same structure as the latch signal generating part 84 of the prior control circuit 80, outputs a row address latch signal LAT.

The structure of the second input part 42 is same as the structure of the second input part 82 of the prior control circuit 80. A signal IN2 generated synchronizing with an external input signal A0 is input to the delay part 43 through serially connected inverters 120, 122, 124 and 126.

In the delay part 43, the signal output from the second input part 42 is output to the output part 45 by way of the following two paths. The first path is provided with a transfer gate TR1 constituted of the PMOS 411 and the NMOS 412, but is not provided with inverters. The second path is provided with a delay path DELAY4 provided with multiple and even numbers of inverters D41, D42, D43 and D44 and a transfer gate TR2 constituted of the NMOS 413 and the PMOS 414.

When the row address intake signal IN1 is in high state, the PMOS 411 and the NMOS 412 are turned off while the NMOS 413 and the PMOS 414 are turned on. The signal is thereby transmitted through the delay path DELAY4. On the other hand, when the row address intake signal IN1 is in low state, the PMOS 411 and the NMOS 412 are turned on while the NMOS 413 and the PMOS 414 are turned off. The signal is thereby transmitted through a path not provided with the inverters. A signal A0D transmitted through either the delay path DELAY4 or through a path not provided with inverters is then output to the output part 45. It is to be noted that the structure of the output part 45 is same as the output part 85 of the prior control circuit 80.

The control circuit 40 according to the fourth embodiment of the invention has the above-mentioned structure. In the next, the operation of the control circuit 40 is described with reference to the timing charts shown in FIG. 7 and FIG. 8.

When the row address intake signal IN1 is in low state, the PMOS 411 and the NMOS 412, which are both in on state, output the state of a signal 410 as the signal A0D. During this operation, the PMOS 414 and the NMOS 413 are in off state. Up to this stage, the operation of the control circuit 40 is same as the operation of the prior control circuit 80. When the row address intake signal IN1 is generated, the signal 101 is switched from high to low state, whereas the signal 103 is switched from low to high state. With this, the PMOS 411 and the NMOS 412 are turned off, while the PMOS 414 and the NMOS 413 are turned on. The state of a signal 415 is thereby output to the signal A0D. In other words, the switch of the signal A0D is delayed by the row address intake signal IN1 delaying the transmission between the signal IN2 and the signal A0D.

As the control circuit 40 according to the fourth embodiment of the invention adapts the above-mentioned constitution and the operation, there is given the following advantageous effects. The switch of the signal A0D from low to high state is delayed by changing the transmission path between the signal IN2 and the signal A0D to a path provided with the delay path DELAY4 after the row address intake signal is generated. Consequently, the THI margin can be increased with increase of a float time TB.

In the next, it is explained with reference to the timing chart of TSI margin of the control circuit 40 shown in FIG. 8 that the TSI margin is not decreased, even though the THI margin is increased by the above-mentioned measure. When the external signal A0 is switched from high to low state with the TSI standard, the signal IN2 is switched from high to low state, switching the signal 410 from high to low state. If the circuit is designed so that the row address intake signal IN1 is kept at low state at this stage of the operation, the PMOS 411 and NMOS the 412 are turned on to output the state of the signal 410 to the signal A0D. Consequently, the signal A0D can be switched at the same timing as the signal in the prior control circuit 80. Thus, the value of a float time TA is made equivalent to the value of a float time TA of the prior control circuit 80. Consequently, the values of the TSI margin are also made equivalent.

(Fifth Preferred Embodiment)

Figure 9:
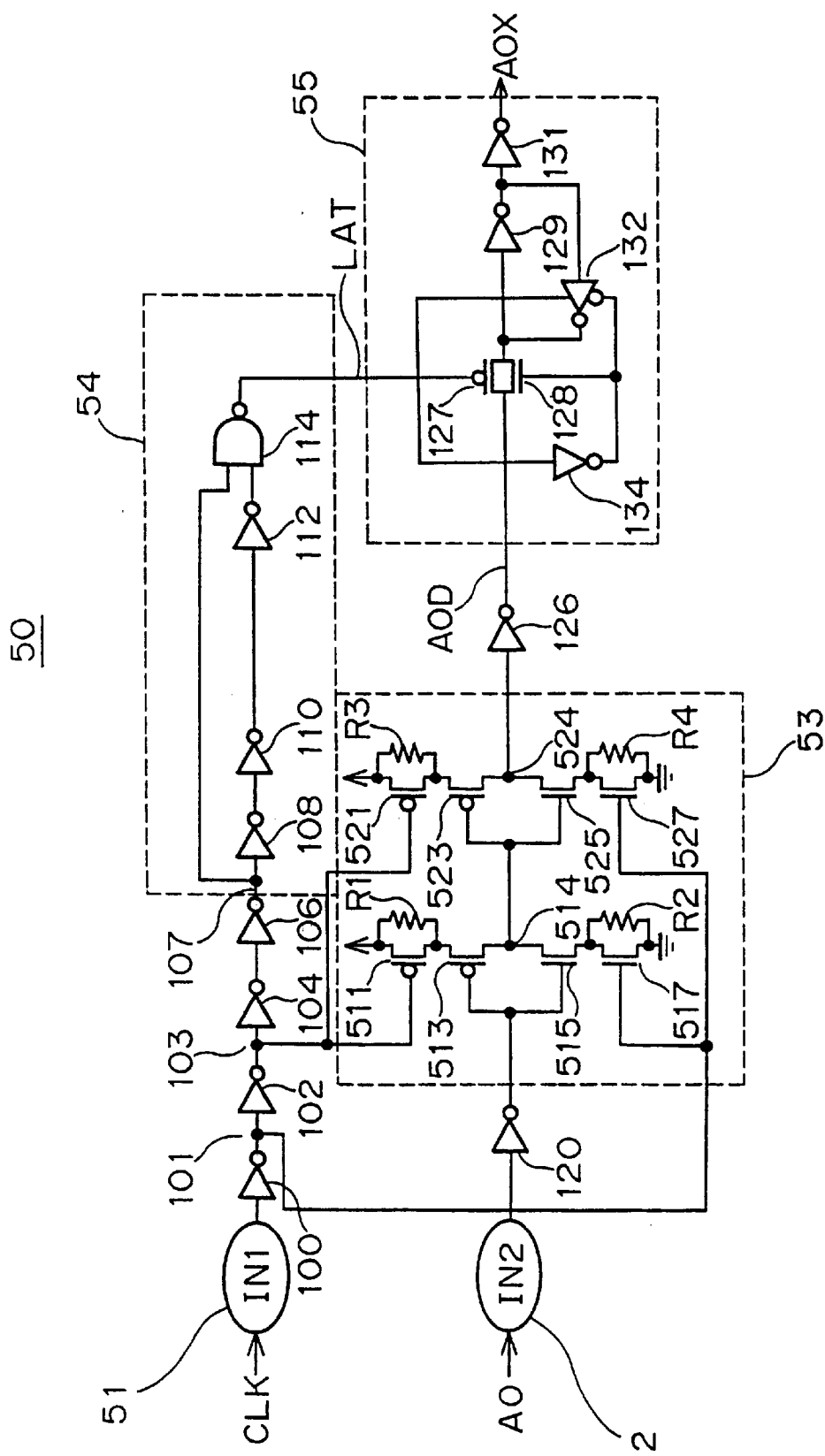
FIG. 9 is a schematic view illustrating the structure of the control circuit according to the fifth embodiment of the present invention.

In the following, a control circuit 50 according to the fifth embodiment of the invention is described with reference to the FIG. 9. It is to be noted that the structures of a first input part 51, a second input part 52 and a delay part 53 of the control circuit 50, which differ from the corresponding parts of the control circuit 40 are explained. The fifth embodiment is characterized in that transmission of a signal is delayed by providing multiple resistances R1, R2, R3 and R4 at the delay part 53.

A row address intake signal IN1 generated synchronizing with an external input signal CLK is branched into two through an inverter 100. One branched signal 101 is input to gates of a NMOS 517 and a NMOS 527 which are provided at the delay part 53. Other branched signal is further branched into two through an inverter 102, one of which (a signal 103) is input to gates of a PMOS 511 and a PMOS 521 which are provided at the delay part 53. The other signal is input to a latch signal generating part 54 through serially connected inverters 104 and 106. The latch signal generating part 54 of which structure is same as the latch signal generation part 84 of the prior control circuit 80, outputs a row address latch signal LAT.

A signal IN2 generated synchronizing with an external input signal A0 is input to gates of a PMOS 513 and a NMOS 515 provided at the delay part 53 through an inverter 120.

The delay part 53 includes the PMOS 511 and the 513 and the NMOS 515 and the 517 which are serially connected, the PMOS 521, 523 and the NMOS 525, 527 which are also connected serially, the resistance R1 which is connected with a source and a drain of the PMOS 511, the resistance R2 which is connected with a source and a drain of the NMOS 517, the resistance R3 which is connected with a source and a drain of the PMOS 521, and the resistance R4 which is connected with a source and a drain of the NMOS 525.

The PMOS 511 is connected with a power source VCC1, the PMOS 521 is connected with a power source VCC2, the NMOS 517 is connected with a ground VSS1 and the NMOS 527 is connected with a ground VSS2. The NMOS 517 and the NMOS 527 are turned on synchronously with the signal 101, while PMOS 511 and PMOS 521 are turned on synchronously with the signal 103.

When PMOS 513 is turned on, a signal 514 in high state is output based on the power source VCC1 supplied through the PMOS 511 and/or the resistance R1. The signal 514 in high state turns on the NMOS 525. On the other hand, when NMOS 515 is turned on, the signal 514 in low state is output based on the ground VSS1 supplied through the NMOS 517 and/or the resistance R2. The signal 514 in low state turns on the PMOS 523.

When PMOS 523 is turned on, a signal 524 in high state based on the power source VCC2 supplied through the PMOS 521 and/or the resistance R3, is output from the delay part 53. On the other hand, when the NMOS 525 is turned on, the signal 524 in low state based on the ground VSS2 supplied through the NMOS 527 and/or the resistance R4, is output from the delay part 53. The signal 524 is transmitted through the inverter 126, and the signal A0D output from the inverter 126 is output to the output part 55, which has the same structure as the output part 85 of the prior control circuit 80.

Figure 7:
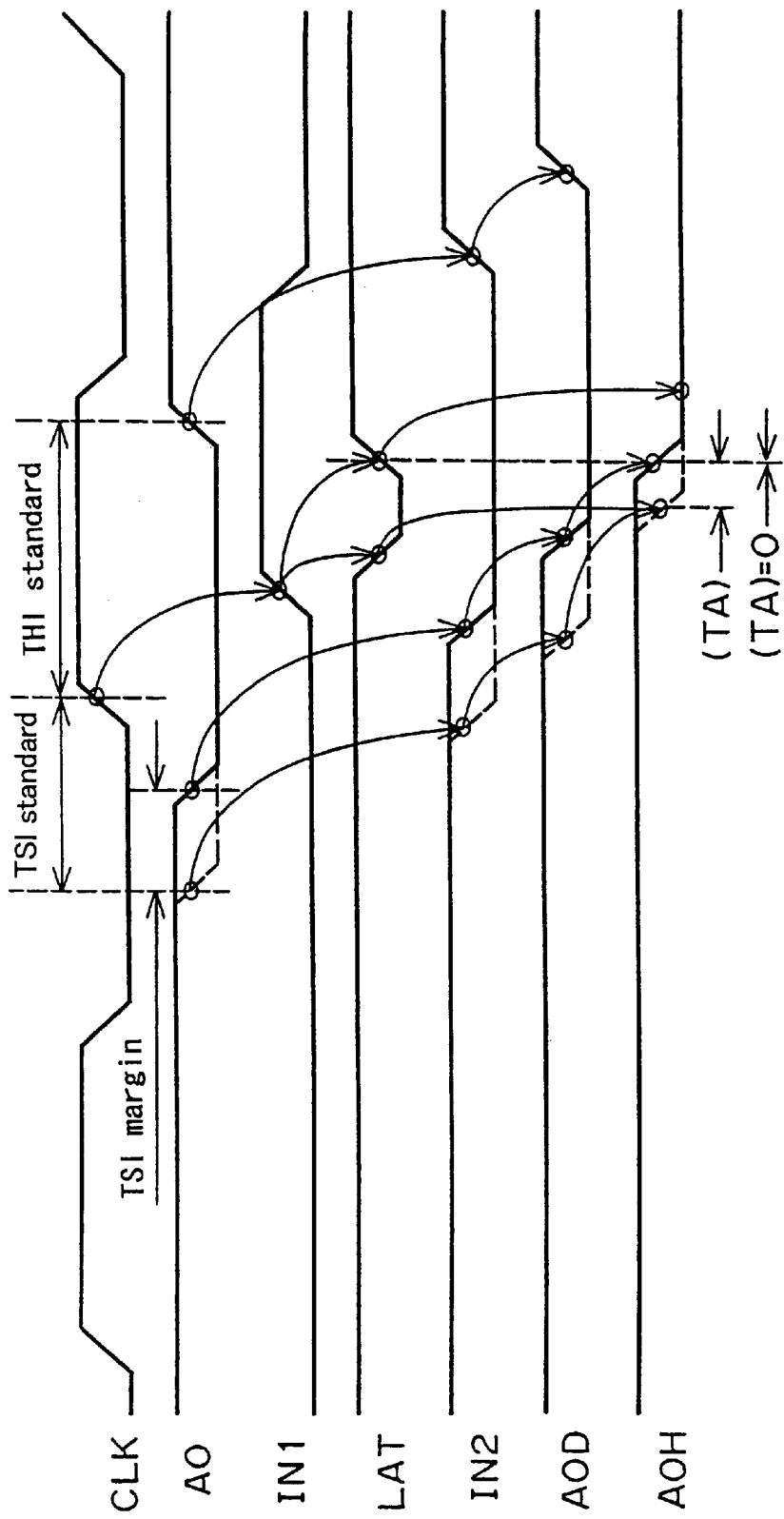
FIG. 7 is a timing chart showing the TSI margin of the control circuit shown in FIG. 6.
Figure 8:
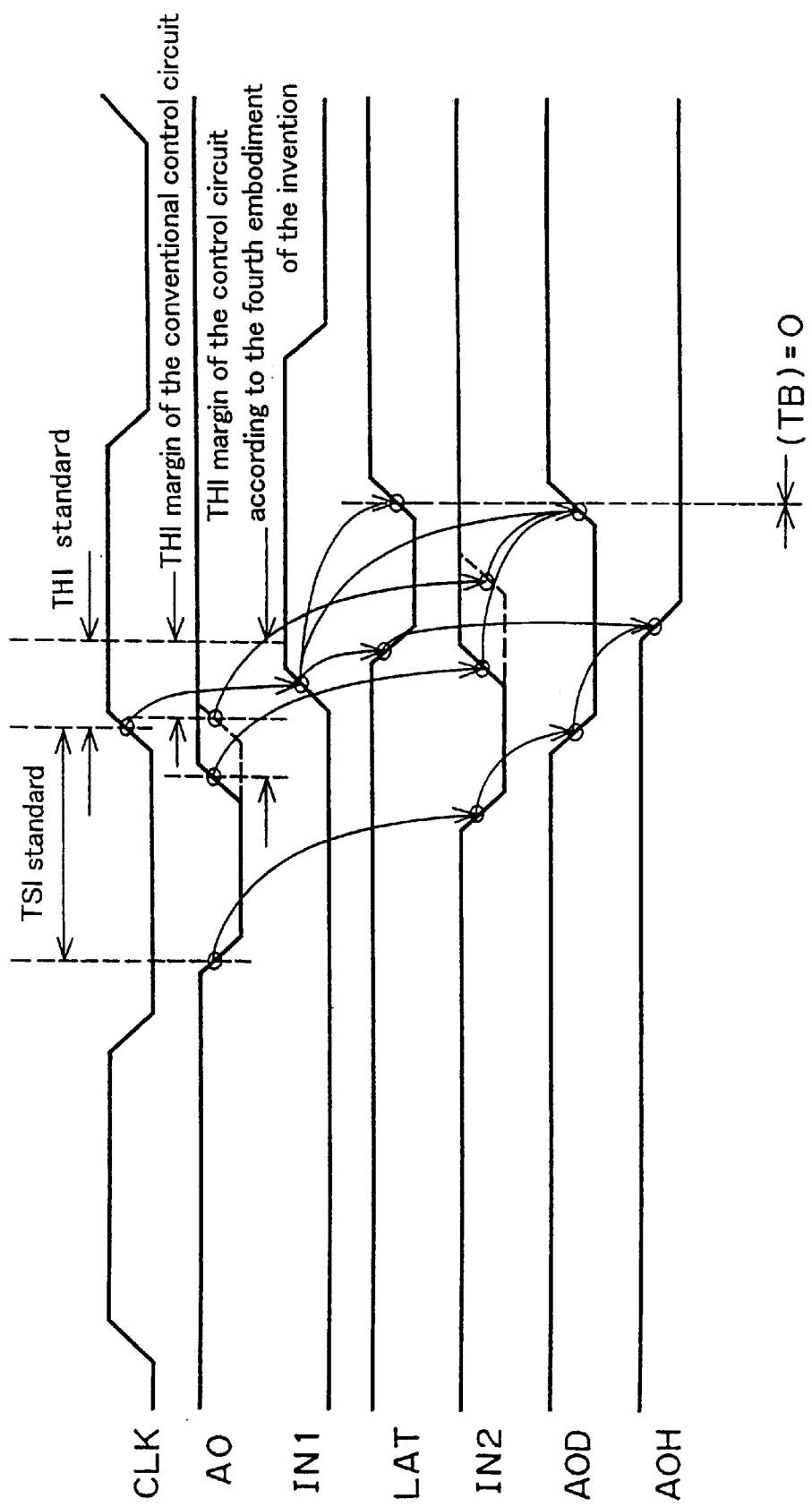
FIG. 8 is a timing chart showing the THI margin of the control circuit shown in FIG. 6.

The timing chart of the control circuit 50 according to the fifth embodiment of the invention is the same as the timing chart of the control circuit 40 according to the fourth embodiment of the invention shown in FIG. 7 and FIG. 8. In the following, the operation of the control circuit 50 is described with reference to the timing chart in FIG. 7 and FIG. 8.

When the row address intake signal IN1 is in low state, transistors of the PMOS 511, the PMOS 521, the NMOS 517 and the NMOS 527 are in on state, while the resistances R1, R2 R3 and R4 are disabled. On the other hand, when the row address intake signal IN1 is generated, the signal 101 is switched from high to low state, whereas the signal 103 is switched from low to high state. Consequently, transistors of the PMOS 511, the PMOS 521, the NMOS 517 and the NMOS 527 are turned off, while the resistances R1, R2, R3 and R4 are enabled.

At this stage, if the state of the signal IN2 changes, the electric charge is made to be transmitted through the resistances R1, R2, R3 and R4. As a result, the transmission between the signal IN2 and the signal A0D can be delayed, because the operation speed of the transistors connected with the resistances is made slower.

As the control circuit 50 according to the fifth embodiment of the invention adapts the above-mentioned constitution and the operation, there is given the following advantageous effects. In addition to the effects of the control circuit 40 that the THI margin can increase, according to the fifth embodiment of the invention, it is also made possible to decrease the momentary current, because transmission of electric charge is made through the resistance. Further, it can be realized that degree of voltage dependence is made relatively small, when the transmission of the signal is delayed.

(Sixth Preferred Embodiment)

Figure 10:
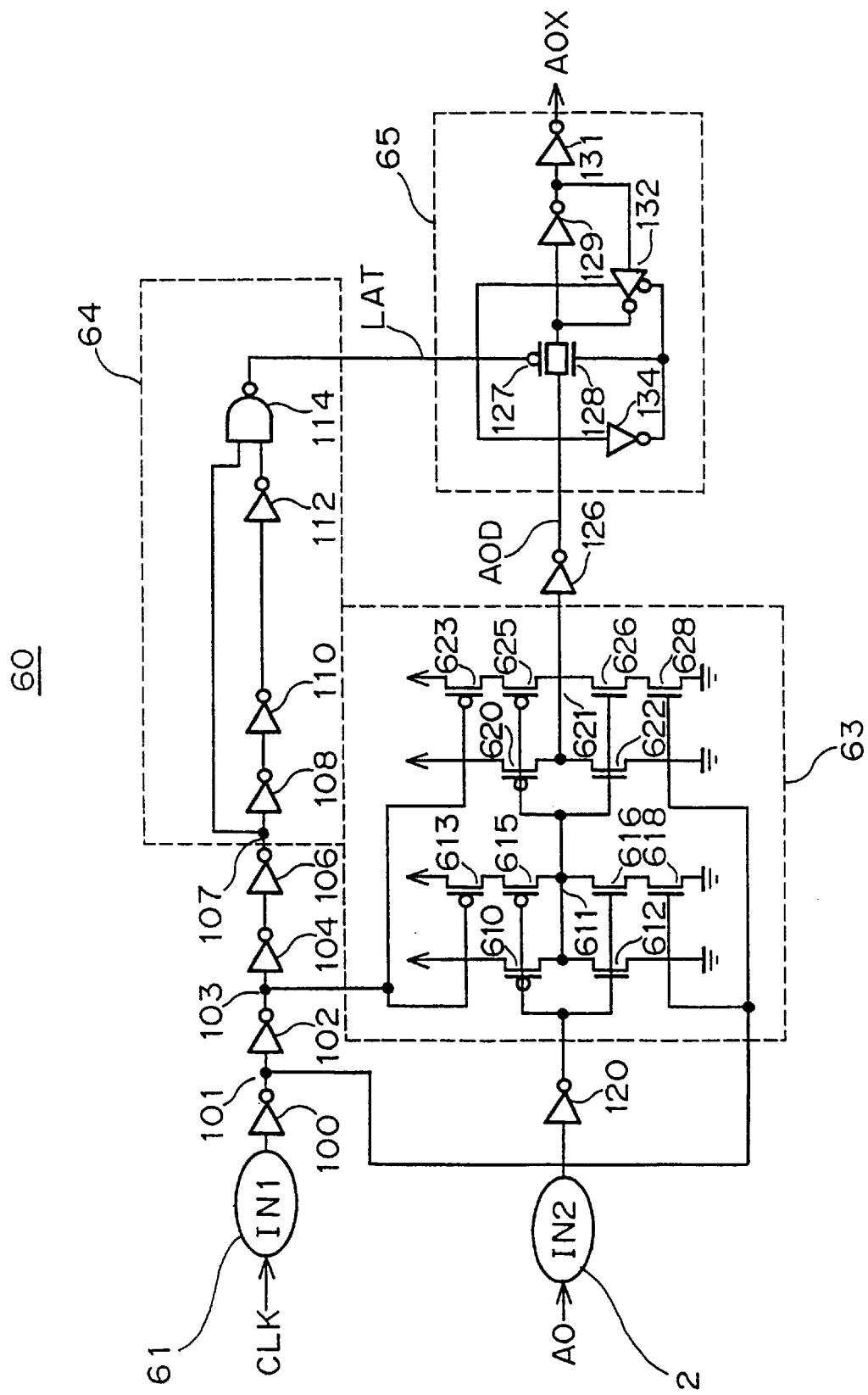
FIG. 10 is a schematic view illustrating the structure of the control circuit according to the sixth embodiment of the present invention.

In the following, a control circuit 60 according to the sixth embodiment of the invention is described with reference to the FIG. 10. It is to be noted that the structures of a first input part 61, a second input part 62 and a delay part 63 of the control circuit 60, which differ from the corresponding parts of the control circuit 40 are explained. The sixth embodiment is characterized in that transmission of a signal is delayed by lowering driving force of transistors provided at the delay part 63.

A row address intake signal IN1 generated synchronizing with an external input signal CLK is branched into two through an inverter 100. One branched signal 101 is input to gates of a NMOS 618 and a NMOS 628 which are provided at the delay part 63. Other branched signal is further branched into two through an inverter 102, one of which (a signal 103) is input to gates of a PMOS 613 and a PMOS 623 which are provided at the delay part 63. Other signal is input to a latch signal generating part 64 through serially connected inverters 104 and 106. The latch signal generating part 64, having the same structure as the latch signal generation part 84 of the prior control circuit 80, outputs a row address latch signal LAT.

A signal IN2 generated synchronizing with an external input signal A0 is input to gates of a PMOS 610, a NMOS 612, a PMOS 615 and a NMOS 616 provided at the delay part 63 through an inverter 120.

The delay part 63 includes the PMOS 610 and the NMOS 612 which are connected serially, and the PMOS 613, 615, the NMOS 616 and NMOS 618 which are serially connected, a PMOS 620 and a NMOS 622 which are connected serially, the PMOS 623, a PMOS 625, a NMOS 626 and the NMOS 628 which are connected serially.

The PMOS 610 is connected with a power source VCC1, the PMOS 613 is connected with a power source VCC2, the PMOS 620 is connected with a power source VCC3, and the PMOS 623 is connected with a power source VCC4. The NMOS 612 is connected with a ground VSS1 and the NMOS 618 is connected with a ground VSS2, the NMOS 622 is connected with a ground VSS3, and the NMOS 628 is connected with a ground VSS4. The NMOS 618 and the NMOS 628 are turned on synchronously with the signal 101, while the PMOS 613 and the PMOS 623 are turned on synchronously with the signal 103.

When the PMOS 610 is turned on, a signal 611 in high state based on the power source VCC1 supplied through the PMOS 610 turns the NMOS 622 in on state. On the other hand, when NMOS 612 is turned on, the signal 611 in low state based on the ground VSS1 supplied through the NMOS 612 turns the PMOS 620 in on state.

When the PMOS 610 is turned on, the PMOS 615 is also turned on. In this case, when the PMOS 613 is turned on, the signal 611 in high state is output based on the power source VCC2 supplied through the PMOS 613 and the PMOS 615. The signal 611 in high state turn the NMOS 622 in on state. On the other hand, when the NMOS 612 is turned on, the NMOS 616 is also turned on. In this case, when the NMOS 618 is turned on, the signal 611 in low state is output based on the ground VSS2 supplied through the NMOS 618 and the NMOS 616. The signal 611 in low state turns the PMOS 620 in on state.

When the PMOS 620 is turned on, a signal 621 in high state based on the power source VCC3 supplied through the PMOS 620 is output from the delay part 63. On the other hand, when NMOS 622 is turned on, the signal 621 in low state based on the ground VSS3 supplied through the NMOS 622 is output from the delay part 63.

When PMOS 620 is turned on, the PMOS 625 is also turned on. In this case, when the PMOS 623 is turned on, the signal 621 in high state based on the power source VCC4 supplied through the PMOS 623 and the PMOS 625 is output from the delay par 63. On the other hand, when the NMOS 622 is turned on, the NMOS 626 is also turned on. In this case, when the NMOS 628 is turned on, the signal 621 in low state based on the ground VSS4 supplied through the NMOS 628 and the NMOS 626 is output from the delay part 63.

The signal 621 is transmitted through an inverter 126, which outputs a signal A0D, and output to an output part 65, having the same structure as the output part 85 of the prior control circuit 80.

The timing chart of the control circuit 60 according to the sixth embodiment of the invention is the same as the timing chart of the control circuit 40 according to the fourth embodiment of the invention shown in FIG. 7 and FIG. 8. In the following, the operation of the control circuit 60 is described with reference to the timing chart in FIG. 7 and FIG. 8.

When the row address intake signal IN1 is in low state, the transistors of the PMOS 613, the PMOS 623, the NMOS 618 and the NMOS 628 are in on state, while the PMOS 615, the PMOS 625, the NMOS 616 and the NMOS 626 are enabled. When the row address intake signal IN1 is generated, the signal 101 is switched from high to low state, whereas the signal 103 is switched from low to high state. Consequently, the transistors of the PMOS 613, the PMOS 623, the NMOS 618 and the NMOS 628 are turned off, while the PMOS 615, the PMOS 625, the NMOS 616 and the NMOS 626 are made disabled. This state is equivalent to a state obtained by decreasing the dimension of the transistors of the inverters and thereby lowering the driving force thereof. At this stage, if the state of the signal IN2 changes, the signal IN2 is transmitted through the inverters of which driving force is lowered. Consequently, the transmission speed of the signal is made slower. As a result, the transmission of the signal from the signal IN2 to the signal A0D can be delayed.

As the control circuit 60 according to the sixth embodiment of the invention adapts the above-mentioned constitution and the operation, there is given the following advantageous effects. In addition to the effects of the control circuit 40 that the THI margin can increase, according to the sixth embodiment of the invention, the value of electric consumption is decreased owing to decrease of the dimension of the transistors.

(Seventh Preferred Embodiment)

Figure 11:
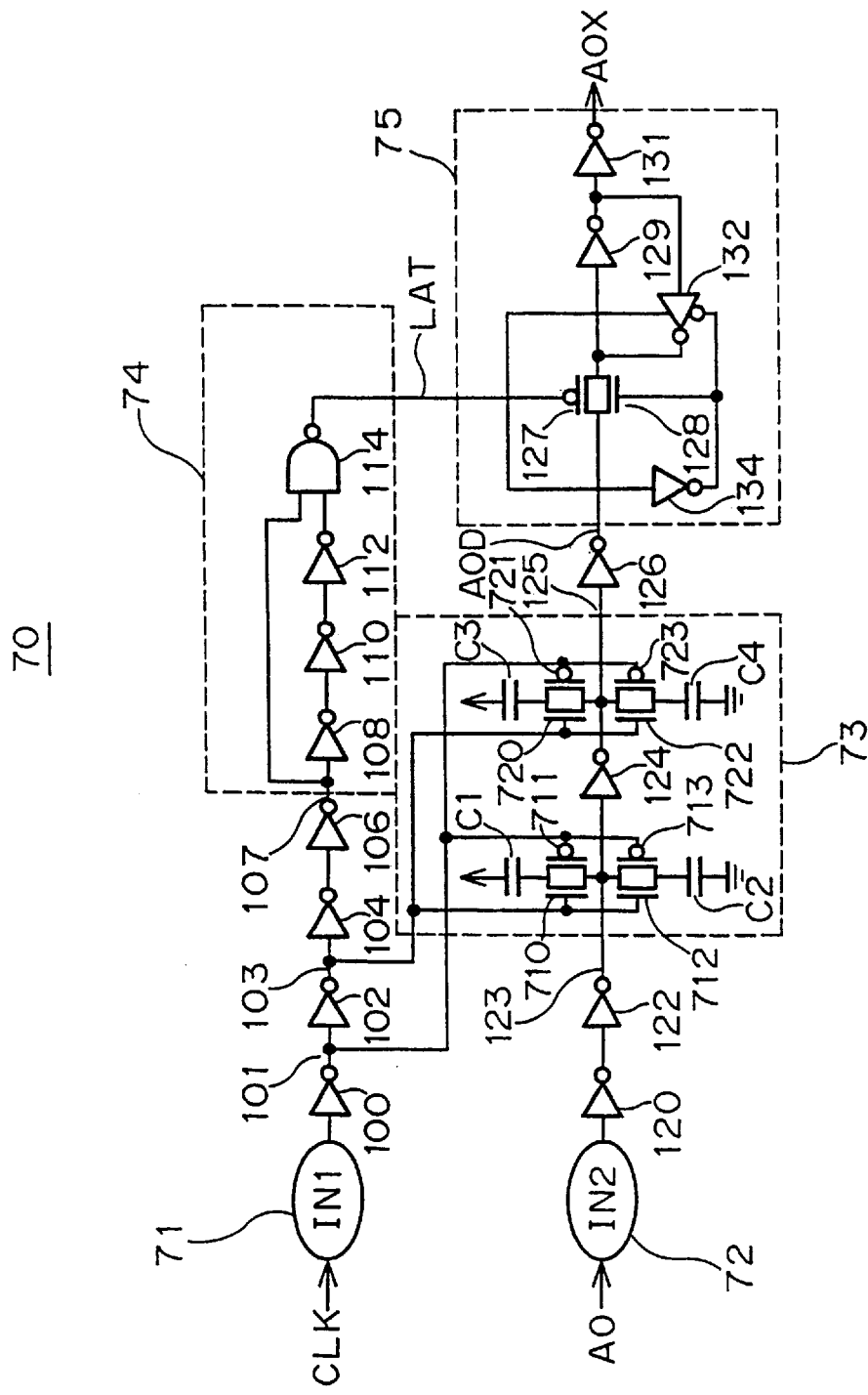
FIG. 11 is a schematic view illustrating the structure of the control circuit according to the seventh embodiment of the present invention.

In the following, a control circuit 70 according to the seventh embodiment of the invention is described with reference to the FIG. 11. It is to be noted that the structures of a first input part 71, a second input part 72 and a delay part 73 of the control circuit 70, which differ from the corresponding parts of the control circuit 40 are explained. The seventh embodiment is characterized in that transmission of a signal is delayed by providing capacitors at the delay part 73.

A row address intake signal IN1 generated synchronizing with an external input signal CLK is branched into two through an inverter 100. One branched signal 101 is input to gates of a PMOS 711, a PMOS 713, a PMOS 721 and a PMOS 723 which are provided at the delay part 73. Other branched signal is further branched into two through an inverter 102, one of which (a signal 103) is input to gates of a NMOS 710, a NMOS 712, a NMOS 720 and a NMOS 722 which are provided at the delay part 73. Other signal is input to a latch signal generating part through serially connected inverters 104 and 106. The latch signal generating part 74 of which structure is same as the latch signal generating part 84 of the prior control circuit 80, outputs a row address latch signal LAT.

A signal IN2 generated synchronizing with an external input signal A0 is transmitted through serially connected inverters 120 and 122, and a signal 123 output from the last inverter 122 is input to the delay part 73.

The delay part 73 includes capacitors C1, C2, C3 and C4, a transfer gate TR1 which includes the NMOS 710 and the PMOS 711, a transfer gate TR2 which includes the NMOS 712 and the PMOS 713, a transfer gate TR3 which includes the NMOS 720 and the PMOS 721 and a transfer gate TR4 which includes the NMOS 722 and the PMOS 723.

The capacitor C1, the transfer gates TR1, TR2 and the capacitor C2 are serially connected. The capacitor C1 is connected with a power source VCC1, while the capacitor C2 is connected with a ground VSS1. The capacitor C3, the transfer gates TR3, TR4 and the capacitor C4 are also serially connected. The capacitor C3 is connected with a power source VCC2, while the capacitor C4 is connected with a ground VSS2. The transfer gates TR1, TR2, TR3 and TR4 are turned on, when the signal 101 is in low state.

When the transfer gates TR1 and TR2 are in on state, and the signal 123 is in high state, transmission of the signal 123 is delayed by the capacitor C2 which is being charged. When the transfer gates TR1 and TR2 are in on state, and the signal 123 is in low state, transmission of the signal 123 is delayed by the capacitor C1 which is being discharged. The signal 123 causes generation of the signal 125 through the inverter 124.

When the transfer gates TR3 and TR4 are in on state, and the signal 125 is in high state, transmission of the signal 125 is delayed by the capacitor C4 which is being charged. When the transfer gates TR3 and TR4 are in on state, and the signal 125 is in low state, transmission of the signal 125 is delayed by the capacitor C3 which is being discharged. The signal 125 causes generation of a signal A0D through an inverter 126, which is output to the output part 75. It is to be noted that the structure of the output part 75 is same as the structure of the output part 85 of the prior control circuit 80.

The timing chart of the control circuit 70 according to the seventh embodiment of the invention is the same as the timing chart of the control circuit 40 according to the fourth embodiment of the invention shown in FIG. 7 and FIG. 8. In the following, the operation of the control circuit 70 is described with reference to the timing chart in FIG. 7 and FIG. 8.

When the row address intake signal IN1 is in low state, transistors of the NMOS 710, the PMOS 711, the NMOS 712 and the PMOS 713, the NOMOS 720, the PMOS 721, the NMOS 722, the PMOS 723 are in off state. When the row address intake signal IN1 is generated, the signal 101 is switched from high to low state, whereas the signal 103 is switched from low to high state. Accordingly, transistors of the NMOS 710, the PMOS 711, the NMOS 712 and the PMOS 713, the NOMOS 720, the PMOS 721, the NMOS 722, the PMOS 723 are turned on, the capacitors C1 and C2 are connected with an output of the inverter 122 and an input of the inverter 124, the capacitors C3 and C4 are connected with an output of the inverter 124 and an input of the inverter 126. At this stage, if the state of the signal IN2 changes, the signal IN2 is transmitted from the capacitor C1 to the capacitor C2 in being charged and discharged alternatively. Consequently, the transmission speed of the signal is made slower. As a result, the transmission between the signal IN2 and the signal A0D can be delayed.

As the control circuit 70 according to the seventh embodiment of the invention adapts the above-mentioned constitution and the operation, there is given the following advantageous effects. In addition to the effects of the control circuit 40 that the THI margin can increase, it is also made possible to decrease the momentary current, because the transmission speed is made slower by charge and discharge of capacitors. Further, if the device adapts this structure, it can be realized that degree of voltage dependence is made relatively small when transmission of the signals are delayed.

As has been discussed so far, according to the invention, the TSI margin can be increased without decreasing the THI margin.

Further, according to the invention, the TSI margin of the DQM signal can also be increased.

In addition, according to the invention, it is also made possible to increase the TSI margin of the address of the external input signal which is made enabled both in low and high state, and of a data input signal.

Still further, according to the invention, the THI margin can increase without decreasing the TSI margin.

Furthermore, according to the invention, it is also made possible to decrease the momentary current, because electric charge is transmitted through the resistances. Further, it can be realized that degree of voltage dependence is made relatively small, when transmission of the signal is delayed.

In addition, according to the invention, it is also made possible to decrease the value of electric consumption, because number of the transistors is decreased.

Moreover, according to the invention, it is also made possible to decrease the momentary current, because the transmission speed is made slower by charge and discharge of capacitors. Further, it can be realized that degree of voltage dependence is made relatively small when the transmission of signals are delayed.

Examples of the semiconductor memory device preferably embodying the invention have been discussed so far, with reference to the accompanying drawings. However, it is apparent that the invention should not be limited by those examples. It may be possible for any one who is skilled in the art to devise various changes and modifications from the teachings described herein without departing from the technical idea as recited in the attached scope of claim for patent, and it will be understood that these changes and modifications fall in the technical scope of the invention.

The entire disclosure of Japanese Patent Application No. 10-136632 filed on May 19, 1998 including specification, claims, drawings and summary is incorporated herein by reference in its entirety.

What is claimed is:

1. A synchronous semiconductor memory device comprising:

a first input part to which a first external input signal is input;

a second input part to which a second external input signal is input;

a latch signal generating part for generating a latch signal in response to the first external input signal;

an output part for latching the second external input signal in response to the latch signal and outputting a latched second external input signal; and an inhibiting signal generating part for generating an inhibiting signal which inhibits the generation of the latch signal in the latch signal generating part in response to the first and second external input signals.

2. The synchronous memory device as set forth in claim 1, wherein the inhibiting signal generating part generates the inhibiting signal only when the state of the second external input signal changes.

3. The synchronous memory device as set forth in claim 2, wherein the inhibiting signal is generated only when the state of the second external input signal changes from high to low.

4. The synchronous memory device as set forth in claim 2, wherein the inhibiting signal is generated only when the state of the second external input signal changes from low to high.

5. A synchronous semiconductor memory device comprising:

a first input part to which a first external input signal is input;

a second input part to which a second external input signal is input;

a latch signal generating part for generating a latch signal in response to the first external input signal;

an output part for latching the second external input signal in response to the latch signal and outputting a latched second external input signal; and a delay part for changing a transmission speed of the second external input signal from the second input part to the output part in response to a transmission of the first external input signal.

6. The synchronous memory device as set forth in claim 5, wherein the delay part is provided with multiple transmission paths for transmitting the second external input signal, a selection part for selecting the transmission paths and one or more inverters provided in the transmission path.

7. The synchronous memory device as set forth in claim 5, wherein the delay part is provided with multiple transmission paths for transmitting the second external input signal, a selection part for selecting the transmission paths and one or more resistances provided in the transmission path.

8. The synchronous memory device as set forth in claim 5, wherein the delay part is provided with multiple transmission paths for transmitting the second external input signal, a selection part for selecting the transmission paths and one or more driving transistors provided in the transmission path the number of which is smaller than the number of driving transistors provided in the ordinary transmission path.

9. The synchronous memory device as set forth in claim 5, wherein the delay part is provided with multiple transmission paths for transmitting the second external input signal, a selection part for selecting the transmission paths and one or more capacitor provided in the transmission path.

* * * * *